United States Patent
Abe et al.

(10) Patent No.: US 10,516,053 B2
(45) Date of Patent: Dec. 24, 2019

(54) FIELD-EFFECT TRANSISTOR, DISPLAY ELEMENT, IMAGE DISPLAY DEVICE, AND SYSTEM

(71) Applicants: Yukiko Abe, Kanagawa (JP); Naoyuki Ueda, Kanagawa (JP); Shinji Matsumoto, Kanagawa (JP); Ryoichi Saotome, Kanagawa (JP); Yuki Nakamura, Tokyo (JP); Yuji Sone, Kanagawa (JP); Sadanori Arae, Kanagawa (JP); Minehide Kusayanagi, Kanagawa (JP)

(72) Inventors: Yukiko Abe, Kanagawa (JP); Naoyuki Ueda, Kanagawa (JP); Shinji Matsumoto, Kanagawa (JP); Ryoichi Saotome, Kanagawa (JP); Yuki Nakamura, Tokyo (JP); Yuji Sone, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 4 days.

(21) Appl. No.: 15/370,392

(22) Filed: Dec. 6, 2016

(65) Prior Publication Data

US 2017/0162704 A1    Jun. 8, 2017

(30) Foreign Application Priority Data

Dec. 8, 2015  (JP) .................................. 2015-239658
Dec. 5, 2016  (JP) .................................. 2016-235622

(51) Int. Cl.
*H01L 29/786*    (2006.01)
*H01L 29/51*     (2006.01)
(Continued)

(52) U.S. Cl.
CPC ...... *H01L 29/78609* (2013.01); *G02F 1/1368* (2013.01); *G09G 3/006* (2013.01);
(Continued)

(58) Field of Classification Search
None
See application file for complete search history.

(56) References Cited

U.S. PATENT DOCUMENTS 9,112,039 B2   8/2015   Ueda et al.
9,418,842 B2   8/2016   Nakamura et al.
(Continued)

FOREIGN PATENT DOCUMENTS

JP   2006-121029   5/2006
JP   2010-021170   1/2010
(Continued)

OTHER PUBLICATIONS

Machine translation of JP 2011-103402A into English.*
(Continued)

*Primary Examiner* — Brian M Butcher
(74) *Attorney, Agent, or Firm* — Oblon, McClelland, Maier & Neustadt, L.L.P.

(57) ABSTRACT

A field-effect transistor including: a gate electrode, which is configured to apply gate voltage; a source electrode and a drain electrode, which are configured to take electric current out; an active layer, which is disposed to be adjacent to the source electrode and the drain electrode and is formed of an oxide semiconductor; and a gate insulating layer, which is disposed between the gate electrode and the active layer, wherein the gate insulating layer contains a paraelectric amorphous oxide containing a Group A element which is an alkaline earth metal and a Group B element which is at least (Continued)

one selected from the group consisting of Ga, Sc, Y, and lanthanoid, and wherein the active layer has a carrier density of $4.0\times10^{17}/cm^3$ or more.

15 Claims, 17 Drawing Sheets

(51) Int. Cl.
| | |
|---|---|
| *H01L 29/24* | (2006.01) |
| *H01L 27/12* | (2006.01) |
| *G02F 1/1368* | (2006.01) |
| *G09G 3/36* | (2006.01) |
| *G09G 3/3225* | (2016.01) |
| *G09G 3/00* | (2006.01) |
| *H01L 29/49* | (2006.01) |
| *H01L 27/32* | (2006.01) |

(52) U.S. Cl.
CPC ......... *G09G 3/3225* (2013.01); *G09G 3/3648* (2013.01); *H01L 27/124* (2013.01); *H01L 27/1225* (2013.01); *H01L 29/24* (2013.01); *H01L 29/4908* (2013.01); *H01L 29/517* (2013.01); *H01L 29/7869* (2013.01); *H01L 29/78696* (2013.01); *G09G 2300/0404* (2013.01); *H01L 27/3262* (2013.01); *H01L 2251/533* (2013.01)

(56) References Cited

U.S. PATENT DOCUMENTS

| | | | |
|---|---|---|---|
| 2012/0248451 A1* | 10/2012 | Sone | ................... H01L 29/4908 257/59 |
| 2014/0042491 A1 | 2/2014 | Chen et al. | |
| 2014/0104507 A1* | 4/2014 | Yamazaki | ........... G02F 1/13338 349/12 |
| 2015/0028334 A1 | 1/2015 | Matsumoto et al. | |
| 2015/0158300 A1 | 6/2015 | Ueda et al. | |
| 2015/0349138 A1 | 12/2015 | Sone et al. | |
| 2016/0013215 A1 | 1/2016 | Ueda et al. | |
| 2016/0042947 A1 | 2/2016 | Nakamura et al. | |
| 2016/0190329 A1 | 6/2016 | Matsumoto et al. | |
| 2016/0267873 A1 | 9/2016 | Saotome et al. | |

FOREIGN PATENT DOCUMENTS

| | | |
|---|---|---|
| JP | 2011-151370 | 8/2011 |
| JP | 2015-046568 | 3/2015 |
| TW | 201407673 A | 2/2014 |

OTHER PUBLICATIONS

Taiwanese official action (and English translation thereof) dated Sep. 19, 2017 in connection with Taiwanese patent application No. 105140667.
K. Nomura, and 5 others "Room-temperature fabrication of transparent flexible thin-film transistors using amorphous oxide semiconductors", Nature, vol. 432, No. 25, Nov. 2004, pp. 488-492.

* cited by examiner

Light

Light

FIELD-EFFECT TRANSISTOR, DISPLAY ELEMENT, IMAGE DISPLAY DEVICE, AND SYSTEM

CROSS-REFERENCE TO RELATED APPLICATIONS

The present application claims priority under 35 U.S.C. § 119 to Japanese Patent Application No. 2015-239658, filed Dec. 8, 2015 and Japanese Patent Application No. 2016-235622, filed Dec. 5, 2016. The contents of which are incorporated herein by reference in their entirety.

BACKGROUND OF THE INVENTION

Field of the Invention

The present disclosure relates to a field-effect transistor, a display element, an image display device, and a system Description of the Related Art Flat panel displays (FPDs), such as liquid crystal displays (LCDs), organic electroluminescent (EL) displays (OLEDs), and electronic paper, are driven by a driving circuit including a thin film transistor (TFT) obtained by incorporating amorphous silicon or polycrystalline silicon into an active layer. FPDs have been required to have a further increase in size, higher definition, and high-speed driving power. Therefore, there is a need for provision of a transistor having the following properties: high carrier mobility; high on•off ratio; and such favorable switching property as rapid rising from the off-state to the on-state.

However, the TFTs obtained by incorporating amorphous silicon (a-Si) or polycrystalline silicon (i.e., in particular, low-temperature poly silicon: LTPS) into an active layer have advantages and disadvantages. Therefore, it is difficult to satisfy all the requirements for the TFTs at the same time.

For example, a-Si TFTs have the following disadvantages. The a-Si TFTs have insufficient mobility for driving a liquid crystal display (LCD) having a large area at high speed and have a large shift of threshold voltage when continuously driven. LTPS-TFTs have high mobility but have large variation in threshold voltage due to a process for crystallizing an active layer through excimer laser annealing. Therefore, a size of mother glass for a mass-production line cannot be enlarged, which is problematic.

Accordingly, there has been proposed a InGaZnO$_4$ (a-IGZO) which can be formed into a film at room temperature and exhibits mobility equal to or higher than mobility of a-Si in an amorphous state (see K. Nomura, 5 others, "Room-temperature fabrication of transparent flexible thin-film transistors using amorphous oxide semiconductors", NATURE, VOL 432, No. 25, November, 2004, pp. 488-492). The proposed material has been a trigger for actively studying amorphous oxide semiconductors having high mobility.

SUMMARY OF THE INVENTION

According to one aspect of the present disclosure, a field-effect transistor includes: a gate electrode, which is configured to apply gate voltage; a source electrode and a drain electrode, which are configured to take electric current out; an active layer, which is disposed to be adjacent to the source electrode and the drain electrode and is formed of an oxide semiconductor; and a gate insulating layer, which is disposed between the gate electrode and the active layer.

The gate insulating layer contains a paraelectric amorphous oxide containing a Group A element which is an alkaline earth metal and a Group B element which is at least one selected from the group consisting of Ga, Sc, Y, and lanthanoid.

The active layer has a carrier density of $4.0 \times 10^{17}/\text{cm}^3$ or more.

DESCRIPTION OF THE EMBODIMENTS (Field-Effect Transistor)

Figure 1:
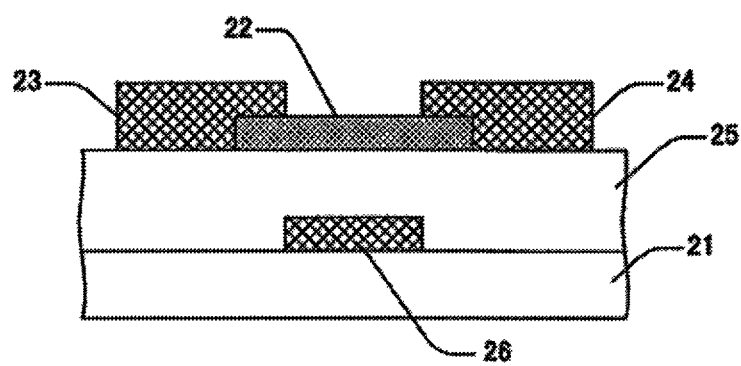
FIG. 1 is a schematic structural view illustrating one example of a top contact/bottom gate field-effect transistor.

A field-effect transistor of the present disclosure includes a gate electrode, a source electrode, a drain electrode, an active layer, and a gate insulating layer, and further includes other members according to the necessity.

The present disclosure has an object to provide a field-effect transistor having the following properties: high mobility; high on•off ratio of electric current between the source and the drain; and rapid rising from the off-state to the on-state (i.e., transfer characteristics).

The present inventors conducted extensive studies in order to achieve the aforementioned object. In order to achieve the aforementioned object, the present inventors have found that it is effective to use: an active layer containing an oxide semiconductor having a carrier density of $4.0 \times 10^{17}/cm^3$ or more; and a gate insulating layer containing a paraelectric amorphous oxide containing a Group A element which is an alkaline earth metal and a Group B element which is at least one selected from the group consisting of Ga, Sc, Y, and lanthanoid. The active layer having a relatively higher carrier density of $4.0 \times 10^{17}/cm^3$ or more is effective in increasing a value of electric current (i.e., a value of the on-current) that flows between a source and a drain in a state where a transistor is ON. Moreover, the present inventors have found the following findings. Specifically, electric characteristics of the gate insulating layer are in order to achieve the characteristics of rapid rising from the off-state to the on-state by effectively controlling many carriers through gate voltage. In particular, a paraelectric amorphous oxide containing a Group A element which is an alkaline earth metal and a Group B element which is at least one selected from the group consisting of Ga, Sc, Y, and lanthanoid is a material suitable for the gate insulating layer in this case. Use of a gate insulating layer containing the above-described material makes it possible to suppress leakage current generated via the gate insulating layer to be low, resulting in reduction in the off-current. Therefore, a transistor having high on•off ratio can be achieved. As described above, the present disclosure has been completed.

According to the present disclosure, it is possible to provide a field-effect transistor having the following properties: high mobility; high on•off ratio of electric current between the source and the drain; and rapid rising from the off-state to the on-state (i.e., transfer characteristics).

<Gate Electrode>

The gate electrode is not particularly limited and may be appropriately selected depending on the intended purpose, so long as the gate electrode is an electrode configured to apply gate voltage.

A material of the gate electrode is not particularly limited and may be appropriately selected depending on the intended purpose. Examples of the material include: metals (e.g., Mo, Al, Au, Ag, and Cu) and alloys of these metals; transparent conductive oxides such as ITO and ATO; and organic conductors such as polyethylene dioxythiophene (PEDOT) and polyaniline (PANI).

A formation method of the gate electrode is not particularly limited and may be appropriately selected depending on the intended purpose. Examples of the formation method include: (i) a method of forming a film through a sputtering method or a dip coating method and patterning the film through photolithography; and (ii) a method of directly forming a film having a desired shape through a printing process such as inkjet printing, nanoimprinting, or gravure printing.

An average thickness of the gate electrode is not particularly limited and may be appropriately selected depending on the intended purpose. However, the average thickness of the gate electrode is preferably from 20 nm through 1 µm, more preferably from 50 nm through 300 nm.

<Gate Insulating Layer>

The gate insulating layer is an insulating layer disposed between the gate electrode and the active layer.

The gate insulating layer contains a paraelectric amorphous oxide containing a Group A element which is an alkaline earth metal (e.g., Be, Mg, Ca, Sr, Ba, and Ra) and a Group B element which is at least one selected from the group consisting of Ga, Sc, Y, and lanthanoid (La, Ce, Pr, Nd, Pm, Sm, Eu, Gd, Tb, Dy, Ho, Er, Tm, Yb, and Lu).

The alkaline earth metal contained in the gate insulating layer may be used alone or in combination.

In terms of improvement in characteristics of transistors, it is a preferable embodiment that the gate insulating layer is formed of an amorphous material. When the gate insulating layer is formed of a crystalline material, leakage current due to grain boundaries cannot be suppressed to be low, leading to deterioration in transistor characteristics.

Also, it is necessary for the gate insulating layer to be a paraelectric in terms of reducing hysteresis in transfer characteristics of transistors. Excluding such a special case that transistors are used for memories and other applications, in general, the existence of hysteresis is not preferable in devices utilizing switching characteristics of transistors.

The paraelectric is a dielectric other than a piezoelectric, a pyroelectric, and a ferroelectric. In other words, the paraelectric refers to a dielectric that neither generates polarization by pressure nor has spontaneous polarization in the absence of an external electric field. Also, the piezoelectric, the pyroelectric, and the ferroelectric are needed to be crystals for developing their characteristics. That is, when a gate insulating layer is formed of an amorphous material, this gate insulating layer naturally becomes a paraelectric.

Alkaline earth metal oxides easily react with moisture and carbon dioxide in the atmosphere, and are easily turned into hydroxides and carbonates. Therefore, the alkaline earth metal oxides alone are not suitable for applications of electric devices. Furthermore, simple oxides of, for example, Ga, Sc, Y, and lanthanoid are easily turned into crystals, which is problematic in terms of generation of leakage current. However, the present inventors found the following findings. Specifically, oxides containing a Group A element which is an alkaline earth metal and a Group B element which is at least one selected from the group consisting of Ga, Sc, Y, and lanthanoid are stable in the atmosphere, and can form an amorphous film having a paraelectric property in a wide range of compositions. Therefore, these oxides are suitably used for the gate insulating layer. Ce becomes tetravalent specifically in the lanthanoid and forms a crystal having a perovskite structure together with the alkaline earth metal. Therefore, in order to obtain an amorphous phase, it is preferable that the Group B element be not Ce.

Although crystalline phases such as a spinel structure exist for oxides containing alkaline earth metal and Ga, these crystals are not precipitated so long as they are heated at a significantly high temperature (generally, at 1,000° C. or more) compared to crystals having the perovskite structure. In addition, no reports have been presented on existence of a stable crystalline phase for oxides containing the alkaline earth metal and Sc, Y, and lanthanoid. Even after the post-process performed at high temperature, the crystal is seldom precipitated from the amorphous phase. Moreover, an amorphous phase becomes more stable when the oxides containing the alkaline earth metal and Ga, Sc, Y, and lanthanoid are formed of three or more metal elements.

In order to prepare a film having high dielectric constant, it is preferable that compositional ratios of elements such as Ba, Sr, Lu, and La be increased.

The gate insulating layer preferably contains a Group C element, which is at least one selected from the group consisting of Al, Ti, Zr, Hf, Nb, and Ta. This can further stabilize an amorphous phase, resulting in improvement of thermal stability and denseness.

A dielectric constant of the gate insulating layer is preferably more than 7.0, more preferably more than 8.0, still more preferably more than 9.0 because rapid rising and high mobility in transfer characteristics can be realized when the active layer has a high carrier density of $4.0 \times 10^{17}/cm^3$ or more. An upper limit of the dielectric constant is not particularly limited and may be appropriately selected depending on the intended purpose. The dielectric constant is preferably 50.0 or less, more preferably 30.0 or less.

A value of the dielectric constant can be calculated from measured values of capacity of condenser formed by sandwiching the insulating layer between electrode films.

A dielectric constant of the gate insulating layer is changed depending on a ratio between the Group A element and the Group B element. Therefore, optimization of formulation of the gate insulating layer is a preferable method in order to satisfy the favorable dielectric constant.

An atomic ratio (NA:NB) between a total number of atoms of the Group A element (NA) and a total number of atoms of the Group B element (NB) in the paraelectric amorphous oxide is not particularly limited and may be appropriately selected depending on the intended purpose, but preferably satisfies the following range.

NA:NB=(from 3 through 50) at %:(from 50 through 97) at %

Here, NA+NB=100 at %

An atomic ratio (NA:NB:NC) among the total number of atoms of the Group A element (NA), the total number of atoms of the Group B element (NB), and a total number of atoms of the Group C element (NC) in the paraelectric amorphous oxide is not particularly limited and may be appropriately selected depending on the intended purpose, but preferably satisfies the following range.

NA:NB:NC=(from 3 through 47) at %:(from 50 through 94) at %:(from 3 through 47) at %

Here, NA+NB+NC=100 at %

The ratios of NA, NB, and NC in the paraelectric amorphous oxide can be calculated, for example, by analyzing a cationic element of the oxide through X-ray fluorescence spectrometry, electron probe microanalysis (EPMA), or inductively coupled plasma atomic emission spectroscopy (ICP-AES).

The above-described material is excellent in insulation property, and has high dielectric breakdown voltage and high dielectric constant. Therefore, when the material is used to form the gate insulating layer, an electric field applied to the active layer via the gate insulating layer can work efficiently under application of gate voltage. Therefore, it is possible to obtain a transistor excellent in switching property of rapid rising from the off-state to the on-state even when there are many carriers in the active layer. Moreover, many carriers can be effectively controlled, and thus it is possible to achieve high on•off ratio (i.e., the off-current is low and the on-current is high). Moreover, hysteresis of transfer curves are small (i.e., difference is small when gate voltage is changed from minus to plus and when gate voltage is changed from plus to minus). In addition, when the gate insulating layer is amorphous, it is easy for an interface between the active layer and the gate insulating layer to be smooth and to have few defects. Therefore, carriers can be easily transferred, resulting in favorable transistor characteristics of high mobility.

—Formation Method of Gate Insulating Layer—

A formation method of the gate insulating layer is not particularly limited and may be appropriately selected depending on the intended purpose. Examples of the formation method include a method of forming a film by a vacuum process, such as sputtering, pulsed laser deposition (PLD), chemical vapor deposition (CVD), or atomic layer deposition (ALD) and patterning the film through photolithography.

Moreover, the gate insulating layer can be formed by preparing a coating liquid containing a precursor of the paraelectric amorphous oxide (coating liquid for forming a gate insulating layer), coating or printing the coating liquid onto an object to be coated, and baking the resultant under appropriate conditions.

——Coating Liquid for Forming Gate Insulating Layer——

The coating liquid for forming a gate insulating layer contains a Group-A-element-containing compound, a Group-B-element-containing compound, and a solvent, preferably contains a Group-C-element-containing compound, further contains other components according to the necessity.

———Group-A-Element-Containing Compound———

Examples of the Group-A-element-containing compound include inorganic compounds of the Group A element and organic compounds of the Group A element. Examples of the Group A element in the Group-A-element-containing compound include Be (beryllium), Mg (magnesium), Ca (calcium), Sr (strontium), Ba (barium), and Ra (radium).

Examples of the inorganic compounds of the Group A element include nitrates of the Group A element, sulfates of the Group A element, chlorides of the Group A element, fluorides of the Group A element, bromides of the Group A element, and iodides of the Group A element.

Examples of the nitrates of the Group A element include magnesium nitrate, calcium nitrate, strontium nitrate, and barium nitrate.

Examples of the sulfates of the Group A element include magnesium sulfate, calcium sulfate, strontium sulfate, and barium sulfate.

Examples of the chlorides of the Group A element include magnesium chloride, calcium chloride, strontium chloride, and barium chloride.

Examples of the fluorides of the Group A element include magnesium fluoride, calcium fluoride, strontium fluoride, and barium fluoride.

Examples of the bromides of the Group A element include magnesium bromide, calcium bromide, strontium bromide, and barium bromide.

Examples of the iodides of the Group A element include magnesium iodide, calcium iodide, strontium iodide, and barium iodide.

The organic compounds of the Group A element are not particularly limited and may be appropriately selected depending on the intended purpose, so long as the organic compounds of the Group A element have the Group A element and an organic group. The Group A element and the organic group are bonded, for example, via an ionic bond, a covalent bond, or a coordination bond.

The organic group is not particularly limited and may be appropriately selected depending on the intended purpose. Examples of the organic group include alkyl groups which may have substituents, alkoxy groups which may have substituents, acyloxy groups which may have substituents, phenyl groups which may have substituents, acetylacetonato groups which may have substituents, and sulfonate groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms, acyloxy groups part of which is substituted with a benzene ring, such as benzoic acid, acyloxy groups part of which is substituted with a hydroxy group, such as lactic acid, and acyloxy groups including two or more carbonyl groups, such as oxalic acid and citric acid.

Examples of the organic compounds of the Group A element include magnesium methoxide, magnesium ethoxide, diethyl magnesium, magnesium acetate, magnesium formate, acetylacetone magnesium, magnesium 2-ethylhexanoate, magnesium lactate, magnesium naphthenate, magnesium citrate, magnesium salicylate, magnesium benzoate, magnesium oxalate, magnesium trifluoromethanesulfonate, calcium methoxide, calcium ethoxide, calcium acetate, calcium formate, acetylacetone calcium, calcium dipivaloyl methanoate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, acetylacetone strontium, strontium 2-ethylhexanoate, strontium lactate, strontium naphthenate, strontium salicylate, strontium oxalate, barium ethoxide, barium isopropoxide, barium acetate, barium formate, acetylacetone barium, barium 2-ethylhexanoate, barium lactate, barium naphthenate, barium neodecanoate, barium oxalate, barium benzoate, and barium trifluoromethanesulfonate.

An amount of the Group-A-element-containing compound in the coating liquid for forming a gate insulating layer is not particularly limited and may be appropriately selected depending on the intended purpose.

———Group-B-Element-Containing Compound———

Examples of the Group B element include Ga (gallium), Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

Examples of the Group-B-element-containing compound include inorganic compounds of the Group B element and organic compounds of the Group B element.

Examples of the inorganic compounds of the Group B element include nitrates of the Group B element, sulfates of the Group B element, fluorides of the Group B element, chlorides of the Group B element, bromides of the Group B element, and iodides of the Group B element.

Examples of the nitrates of the Group B element include gallium nitrate, scandium nitrate, yttrium nitrate, lanthanum nitrate, cerium nitrate, praseodymium nitrate, neodymium nitrate, samarium nitrate, europium nitrate, gadolinium nitrate, terbium nitrate, dysprosium nitrate, holmium nitrate, erbium nitrate, thulium nitrate, ytterbium nitrate, and lutetium nitrate.

Examples of the sulfates of the Group B element include gallium sulfate, scandium sulfate, yttrium sulfate, lanthanum sulfate, cerium sulfate, praseodymium sulfate, neodymium sulfate, samarium sulfate, europium sulfate, gadolinium sulfate, terbium sulfate, dysprosium sulfate, holmium sulfate; erbium sulfate, thulium sulfate, ytterbium sulfate, and lutetium sulfate.

Examples of the fluorides of the Group B element include gallium fluoride, scandium fluoride, yttrium fluoride, lanthanum fluoride, cerium fluoride, praseodymium fluoride, neodymium fluoride, samarium fluoride, europium fluoride, gadolinium fluoride, terbium fluoride, dysprosium fluoride, holmium fluoride, erbium fluoride, thulium fluoride, ytterbium fluoride, and lutetium fluoride.

Examples of the chlorides of the Group B element include gallium chloride, scandium chloride, yttrium chloride, lanthanum chloride, cerium chloride, praseodymium chloride, neodymium chloride, samarium chloride, europium chloride, gadolinium chloride, terbium chloride, dysprosium chloride, holmium chloride, erbium chloride, thulium chloride, ytterbium chloride, and lutetium chloride.

Examples of the bromides of the Group B element include gallium bromide, scandium bromide, yttrium bromide, lanthanum bromide, praseodymium bromide, neodymium bromide, samarium bromide, europium bromide, gadolinium bromide, terbium bromide, dysprosium bromide, holmium bromide, erbium bromide, thulium bromide, ytterbium bromide, and lutetium bromide.

Examples of the iodides of the Group B element include gallium iodide, scandium iodide, yttrium iodide, lanthanum iodide, cerium iodide, praseodymium iodide, neodymium iodide, samarium iodide, europium iodide, gadolinium iodide, terbium iodide, dysprosium iodide, holmium iodide, erbium iodide, thulium iodide, ytterbium iodide, and lutetium iodide.

The organic compounds of the Group B element are not particularly limited and may be appropriately selected depending on the intended purpose, so long as the organic compounds of the Group B element have the Group B element and an organic group. The Group B element and the organic group are bonded, for example, via an ionic bond, a covalent bond, or a coordination bond.

The organic group is not particularly limited and may be appropriately selected depending on the intended purpose. Examples of the organic group include alkyl groups which may have substituents, alkoxy groups which may have substituents, acyloxy groups which may have substituents, acetylacetonato groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

Examples of the organic compounds of the Group B element include gallium acetylacetonato, scandium isopropoxide, scandium acetate, tris(cyclopentadienyl)scandium, yttrium isopropoxide, yttrium 2-ethylhexanoate, tris(acetylacetonato)yttrium, tris(cyclopentadienyl)yttrium, lanthanum isopropoxide, lanthanum 2-ethylhexate, tris(acetylacetonato)lanthanum, tris(cyclopentadienyl)lanthanum, cerium 2-ethylhexanoate, tris(acetylacetonato)cerium, tris(cyclopentadienyl)cerium, praseodymium isopropoxide, praseodymium oxalate, tris(acetylacetonato)praseodymium, tris(cyclopentadienyl)praseodymium, neodymium isopropoxide, neodymium 2-ethylhexanoate, trifluoroacetylacetonato neodymium, tris(isopropyl cyclopentadienyl)neodymium, tris(ethylcyclopentadienyl)promethium, samarium isopropoxide, samarium 2-ethylhexanoate, tris(acetylacetonato)samarium, tris(cyclopentadienyl)samarium, europium 2-ethylhexanoate, tris(acetylacetonato)europium, tris(ethylcyclopentadienyl)europium, gadolinium isopropoxide, gadolinium 2-ethylhexanoate, tris(acetylacetonato)gadolinium, tris(cyclopentadienyl)gadolinium, terbium acetate, tris(acetylacetonato)terbium, tris(cyclopentadienyl)terbium, dysprosium isopropoxide, dysprosium acetate, tris(acetylacetonato)dysprosium, tris(ethylcyclopentadienyl)dysprosium, holmium isopropoxide, holmium acetate, tris(cyclopentadienyl)holmium, erbium isopropoxide, erbium acetate, tris(acetylacetonato)erbium, tris(cyclopentadienyl)erbium, thulium acetate, tris(acetylacetonato)thulium, tris(cyclopentadienyl)thulium, ytterbium isopropoxide, ytterbium acetate, tris(acetylacetonato)ytterbium, tris(cyclopentadienyl)ytterbium, lutetium oxalate, and tris(ethylcyclopentadienyl)lutetium.

An amount of the Group-B-element-containing compound in the coating liquid for forming a gate insulating layer is not particularly limited and may be appropriately selected depending on the intended purpose.

——Group-C-Element-Containing Compound——

Examples of the Group C element include Al (aluminium), Ti (titanium), Zr (zirconium), Hf (hafnium), Nb (niobium), and Ta (tantalum).

Examples of the Group-C-element-containing compound include inorganic compounds of the Group C element and organic compounds of the Group C element.

Examples of the inorganic compounds of the Group C element include nitrates of the Group C element, sulfates of the Group C element, fluorides of the Group C element, chlorides of the Group C, bromides of the Group C element, and iodides of the Group C element.

The organic compounds of the Group C element are not particularly limited and may be appropriately selected depending on the intended purpose, so long as the organic compounds of the Group C element have the Group C element and an organic group. The Group C element and the organic group are bonded, for example, via an ionic bond, a covalent bond, or a coordination bond.

The organic group is not particularly limited and may be appropriately selected depending on the intended purpose. Examples of the organic group include alkyl groups which may have substituents, alkoxy groups which may have substituents, acyloxy groups which may have substituents, acetylacetonato groups which may have substituents, and cyclopentadienyl groups which may have substituents. Examples of the alkyl groups include alkyl groups containing from 1 through 6 carbon atoms. Examples of the alkoxy groups include alkoxy groups containing from 1 through 6 carbon atoms. Examples of the acyloxy groups include acyloxy groups containing from 1 through 10 carbon atoms.

An amount of the Group-C-element-containing compound in the coating liquid for forming a gate insulating layer is not particularly limited and may be appropriately selected depending on the intended purpose.

——Solvent——

The solvent is not particularly limited and may be appropriately selected depending on the intended purpose, so long as the solvent stably dissolves or disperses the various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, ethyl benzoate, N,N-dimethylformamide, propylene carbonate, 2-ethylhexanoic acid, mineral spirits, dimethylpropylene urea, 4-butyrolactone, 2-methoxyethanol, ethylene glycol, propylene glycol, isopropyl alcohol, methanol, and water.

An amount of the solvent in the coating liquid for forming a gate insulating layer is not particularly limited and may be appropriately selected depending on the intended purpose.

A compositional ratio between the Group-A-element-containing compound and the Group-B-element-containing compound in the coating liquid for forming a gate insulating layer is not particularly limited and may be appropriately selected depending on the intended purpose, but preferably satisfies the following range.

That is, the compositional ratio preferably falls within the following range in terms of an atomic ratio (NA:NB) between a total number of atoms of the Group A element (NA) and a total number of atoms of the Group B element (NB) in each compound.

NA:NB=(from 3 through 50) at %:(from 50 through 97) at %

Here, NA+NB=100 at %

A compositional ratio among the Group-A-element-containing compound, the Group-B-element-containing compound, and the Group-C-element-containing compound in the coating liquid for forming a gate insulating layer is not particularly limited and may be appropriately selected depending on the intended purpose, but preferably satisfies the following range.

That is, the compositional ratio preferably falls within the following range in terms of an atomic ratio (NA:NB:NC) among a total number of atoms of the Group A element (NA), a total number of atoms of the Group B element (NB), and a total number of atoms of the Group C element (NC) each of which is incorporated into each compound.

NA:NB:NC=(from 3 through 47) at %:(from 50 through 94) at %:(from 3 through 47) at %

——Method for Forming Gate Insulating Layer Using Coating Liquid for Forming Gate Insulating Layer——

One example of a method for forming the gate insulating layer using the coating liquid for forming a gate insulating layer will be described hereinafter. The method for forming the gate insulating layer includes a coating step and a heat treatment step, and further includes other steps according to the necessity.

The coating step is not particularly limited and may be appropriately selected depending on the intended purpose, so long as the coating step is a step of coating the coating liquid for forming a gate insulating layer on an object to be coated. The coating method is not particularly limited and may be appropriately selected depending on the intended purpose. For example, the coating is performed in the following manner. Specifically, a film is formed through a solution process and is subjected to patterning through photolithography. Alternatively, a film having a desired shape is directly formed through a printing method such as inkjet printing, nanoimprinting, and gravure printing. Examples of the solution process include dip coating, spin coating, die coating, and nozzle printing.

The heat treatment step is not particularly limited and may be appropriately selected depending on the intended purpose, so long as the heat treatment step is a step of subjecting, to a heat treatment, the coating liquid for forming a gate insulating layer coated on the object to be coated. Here, when the heat treatment is performed, the coating liquid for forming a gate insulating layer coated on the object to be coated may be subjected to air drying. Through the heat treatment, the solvent is dried and the paraelectric amorphous oxide is generated.

In the heat treatment step, evaporation of the solvent (hereinafter referred to as "evaporation treatment") and generation of the paraelectric amorphous oxide (hereinafter referred to as "generation treatment") are preferably performed at different temperatures. Specifically, it is preferable that after the evaporation of the solvent, the temperature be elevated to generate the paraelectric amorphous oxide. At the time of generation of the paraelectric amorphous oxide, for example, the Group-A-element-containing compound, the Group-B-element-containing compound, and the Group-C-element-containing compound are decomposed A temperature of the evaporation treatment is not particularly limited and may be appropriately selected depending on the solvent contained. For example, the temperature of the evaporation treatment is from 80° C. through 180° C. As for the evaporation, it is effective to use a vacuum oven for reducing the required temperature.

A time of the evaporation treatment is not particularly limited and may be appropriately selected depending on the intended purpose. For example, the time of the evaporation treatment is from 1 minute through 1 hour.

A temperature of the generation treatment is not particularly limited and may be appropriately selected depending on the intended purpose. The temperature of the generation treatment is preferably from 100° C. or more but less than 550° C., more preferably from 200° C. through 500° C. A time of the generation treatment is not particularly limited and may be appropriately selected depending on the intended purpose. For example, the time of the generation treatment is from 1 hour through 5 hours.

Note that, in the heat treatment step, the evaporation treatment and the generation treatment may be continuously performed or may be performed in a divided manner of a plurality of steps.

A method of the heat treatment is not particularly limited and may be appropriately selected depending on the intended purpose. Examples of the method of the heat treatment include a method of heating the object to be coated. An atmosphere in the heat treatment is not particularly limited and may be appropriately selected depending on the intended purpose. However, the atmosphere is preferably an oxygen atmosphere. When the heat treatment is performed in the oxygen atmosphere, decomposed products can be promptly discharged to the outside of the system and generation of the paraelectric amorphous oxide can be accelerated.

In the heat treatment, in view of acceleration of reaction of the generation treatment, it is effective to apply ultraviolet rays having a wavelength of 400 nm or shorter to the material after the evaporation treatment. Applying the ultraviolet rays having a wavelength of 400 nm or shorter can cleave chemical bonds of the organic material contained in the material after the evaporation treatment and can decompose the organic material. Therefore, the paraelectric amorphous oxide can be efficiently formed. The ultraviolet rays having a wavelength of 400 nm or shorter are not particularly limited and may be appropriately selected depending on the intended purpose. Examples of the ultraviolet rays include ultraviolet rays having a wavelength of 222 nm emitted from an excimer lamp. It is also preferable to apply ozone instead of or in combination with the ultraviolet rays. Applying the ozone to the material after the evaporation treatment accelerates generation of the oxide.

An average thickness of the gate insulating layer is not particularly limited and may be appropriately selected depending on the intended purpose, but is preferably from 50 nm through 3 μm, more preferably from 100 nm through 1 μm.

<Active Layer>

The active layer is a layer disposed to be adjacent to the source electrode and the drain electrode.

The active layer is an oxide semiconductor having a carrier density of $4.0 \times 10^{17}/cm^3$ or more. The carrier density is more preferably $1.0 \times 10^{18}/cm^3$ or more. An upper limit of the carrier density may be appropriately selected depending on the intended purpose, but is preferably $1.0 \times 10^{21}/cm^3$ or less, more preferably $1.0 \times 10^{20}/cm^3$ or less. This is because control by gate voltage cannot work well when an amount of carriers is too excessive.

A transistor of the present disclosure achieves a high value of the on-current by incorporating the oxide semiconductor having a high carrier density into the active layer, and has characteristics of rapid rising and high mobility because the gate insulating layer formed of the aforementioned materials makes it possible to effectively control many carriers.

The carrier density can be measured by performing Hall measurement of the oxide semiconductor film.

A method for adjusting a carrier density of the active layer is not particularly limited and may be appropriately selected depending on the intended purpose. Examples of the method include adjustment of formulation of the oxide and adjustment of heating temperatures and atmosphere conditions during film formation processes.

A preferable aspect is that the active layer is an n-type oxide semiconductor including at least one selected from the group consisting of In, Zn, Sn, and Ti.

Moreover, it is preferable that the n-type oxide semiconductor undergo substitutional doping with at least one dopant selected from the group consisting of a divalent cation, a trivalent cation, a tetravalent cation, a pentavalent cation, a hexavalent cation, a heptavalent cation, and an octavalent cation, and a valence of the dopant be more than a valence of a metal ion constituting the n-type oxide semiconductor, provided that the dopant is excluded from the metal ion. Here, the substitutional doping may be referred to as n-type doping.

In the n-type oxide semiconductor subjected to substitutional doping, part of the metal ions constituting the n-type oxide semiconductor, which is a mother phase, is substituted with a dopant having a higher valence than the valence of the metal ion, and extra electrons generated because of a difference in valence are released to serve as n-type conductive carriers. In a case where the carrier electrons generated by the substitutional doping are responsible for semiconductor characteristics, the semiconductor characteristics become more stable. The reason for this is as follows. Specifically, the number of carrier electrons attributed to oxygen vacancies are easily changed by undergoing influences (e.g., oxidation-reduction reactions and adsorption of oxygen onto a surface of the film) when oxygen is exchanged between the semiconductor and the exterior (the atmosphere or the adjacent layer). Meanwhile, the number of carrier electrons attributed to substitutional doping is relatively free from an influence of such changes in the state.

Moreover, the number of carrier electrons attributed to substitutional doping can be favorably controlled, and a desired carrier concentration can be easily achieved, which is one advantage. As described above, oxygen relatively easily moves in and out of the semiconductor, and thus it is difficult to accurately control an amount of oxygen or maintain the amount of oxygen to a predetermined value. Meanwhile, the number of the carrier electrons attributed to the substitutional doping can be easily and accurately controlled by appropriately selecting a kind of the dopant element and a doping amount.

An active layer of the field-effect transistor of the present disclosure has a carrier density of $4.0\times10^{17}/cm^3$ or more. A preferable aspect is that the active layer can achieve the aforementioned carrier density by appropriately selecting a kind and an amount of the dopant element. Preferably, oxygen vacancies in the active layer are reduced as much as possible by adjusting the formulation and the condition of the film forming process, and the carriers are mainly generated through substitutional doping.

In order to reduce oxygen vacancies in the active layer, it is effective to introduce more oxygen atoms into the film during the film formation process of the n-type oxide semiconductor layer (active layer). For example, in a case where the n-type oxide semiconductor layer is formed by a sputtering method, a film having less oxygen vacancies can be formed by increasing the oxygen concentration in the atmosphere during the sputtering. Alternatively, in a case where the n-type oxide semiconductor layer is formed by coating and baking the coating liquid, a film having less oxygen vacancies can be formed by increasing the oxygen concentration in the atmosphere during the baking.

Moreover, an amount of the oxygen vacancies can be reduced depending on the formulation of the n-type oxide semiconductor. For example, generation of oxygen vacancies can be suppressed by introducing a certain amount of a metal element having high affinity to oxygen (e.g., Si, Ge, Zr, Hf, Al, Ga, Sc, Y, Ln, and alkaline earth metals).

The kind of the dopant is preferably selected depending on an ionic radius, the number of coordination, and an orbital energy. A concentration of the dopant may be appropriately selected depending on a material of the mother phase, the kind of the dopant, a site to be substituted by the dopant, a film formation process, and desired transistor characteristics.

Theoretically, the number of electrons generated when one atom is substituted is a value obtained by subtracting a valence of a metal atom of a mother phase constituting the n-type oxide semiconductor from a valence of a cation (i.e., dopant). That is, the valence of the dopant is preferably large in order to generate the same number of electrons in a smaller doping amount. Moreover, a difference between the valence of the dopant and the valence of the metal atom constituting the n-type oxide semiconductor is preferably larger. When the dopants are excessively present, crystal structures and alignments of atoms are disturbed, which prevents carrier electrons from movements. Accordingly, a preferable embodiment is to generate a necessary and sufficient amount of carrier electrons in as small a doping amount as possible.

Moreover, a preferable embodiment is that a selected dopant has an ionic radius close to a radius of an atom to be substituted. This leads to improvement in substitution efficiency and can prevent an unnecessary dopant not contributing to generation of carriers from deteriorating transistor characteristics.

An efficiency of generating carriers through doping depends on various process conditions at the time of the production of transistors, and therefore it is also important to select process conditions that can improve the carrier generation efficiency. For example, a desired carrier concentration can be achieved in a smaller doping amount by appropriately selecting: a temperature of a substrate when a n-type oxide semiconductor layer is formed by sputtering; a baking temperature when a n-type oxide semiconductor layer is formed by coating and baking a coating liquid; and a temperature of annealing performed after formation of the n-type oxide semiconductor layer.

A concentration of the dopant is not particularly limited and may be appropriately selected depending on the intended purpose. In terms of mobility and rising property, the concentration of the dopant is preferably from 0.01 at % through 10 at %, more preferably from 0.01 at % through 5 at %, particularly preferably from 0.05 at % through 2 at %. Here, "at %" denotes a ratio of the number of atoms of the dopant to a sum (100%) of the number of atoms of the dopant and the number of atoms of the metal element to be substituted with the dopant in the semiconductor (i.e., the number of moles of the metal element which is substituted with the dopant and is incorporated into the n-type oxide semiconductor). The oxide semiconductor can have a carrier concentration of $4.0\times10^{17}$ $cm^{-3}$ or more and carrier mobility of 0.1 $cm^2/Vs$ or more by adjusting the doping amount satisfying the aforementioned range and appropriately setting the process conditions. This oxide semiconductor is preferably used for the active layer of the field-effect transistor of the present disclosure.

The n-type oxide semiconductor forming an active layer is preferably in a state of monocrystalline or polycrystalline in order for substitutional doping to effectively work. Even in a case where diffraction peaks from the n-type oxide semiconductor are not observed by X-ray diffraction (XRD) and a long-distance order is not present (typically such a state is referred to as an amorphous state), the n-type oxide semiconductor preferably has a rigid structure where atoms are aligned orderly in a short distance. The above-described structure is preferable for the following reason. Specifically, in the case where an oxide semiconductor to be a mother phase is a highly amorphous material, the structure is changed to a locally stable state and carriers are not generated even after substitutional doping. In the case of the oxide having the rigid structure, oxygen-coordinating polyhedrons (e.g., $WO_6$ or $InO_6$ octahedrons) and their linking manners (e.g., $InO_6$ edge-sharing chains) are maintained, and substitutional doping effectively works. In this structure, a density of tail states unique to the amorphous state is small and therefore sub-gap absorption is small. As a result, photodeterioration of the material having the above structure is smaller than highly amorphous materials.

Doping is similarly effective on the n-type oxide semiconductor even in a monocrystalline or polycrystalline state in which a long-distance order is present. In a case where conduction bands are formed with 4s, 5s, and 6s bands of heavy metal ions, an influence from grain boundaries is small, and excellent characteristics are obtained even in a polycrystalline state. In a case where a doping amount is excessive and the dopant is segregated at grain boundaries, it is preferable to lower the concentration of the dopant. It is also preferable to perform post annealing at a temperature of from 200° C. through 300° C. in order to improve adhesion and electrical contacts at an interface between the source and drain electrodes and the active layer. Moreover, annealing may be performed at a higher temperature to enhance crystallinity.

According to the studies conducted by the present inventors, when an oxide containing at least one selected from the group consisting of In, Zn, Sn, and Ti is selected as a mother phase of the n-type oxide semiconductor, substitutional doping more effectively works to obtain more excellent transistor characteristics.

It is effective to include an element having high affinity to oxygen in the active layer for the purpose of reducing oxygen vacancies, as described above. It has been found that the element having high affinity to oxygen is suitably Si, Ge, Zr, Hf, Al, Ga, Sc, Y, Ln, or an alkaline earth metal.

A method for forming the active layer is not particularly limited and may be appropriately selected depending on the intended purpose.

The substitutional doping can be easily performed by adding a raw material of the dopant to a raw material of a mother layer when the active layer is formed. For example, in a case where an active layer is formed by a sputtering method, it may be possible to use a target including a mother phase to which a dopant element has been added at a predetermined concentration. In a case where a predetermined doping amount is small (e.g., 0.2 at % or less), it is difficult to uniformly incorporate such a small amount of atoms into the entire target in an accurate amount.

In terms of control of a doping amount, it is preferable that an active layer be formed through a coating process. In the coating process, a coating liquid for forming an n-type oxide semiconductor film including a raw material compound of a semiconductor, a compound including an element to be a dopant (dopant-element-containing compound), and a solvent is coated on an object to be coated through coating, and is baked to form an active layer. When a mixing ratio of the dopant-element-containing compound to the raw material compound of a semiconductor satisfies a desired doping amount, a desired doping can be realized. The dopant-element-containing compound can be easily added to the coating liquid so as to have an amount of the dopant of 0.2 at % or less (i.e., considerably small amount) and can be homogeneously stirred. Therefore, it is believed that a coating process is more suitable as a method for forming an n-type oxide semiconductor that has undergone substitutional doping.

<Source Electrode and Drain Electrode>

The source electrode and the drain electrode are not particularly limited and may be appropriately selected depending on the intended purpose, so long as they are electrodes configured to take electric current out.

Materials of the source electrode and the drain electrode are not particularly limited and may be appropriately selected depending on the intended purpose. Examples of the materials include metals (e.g., Mo, Al, and Ag) and alloys of the metals, transparent conductive oxides (e.g., ITO and ATO), and organic conductors such as polyethylenedioxythiophene (PEDOT) and polyaniline (PANI).

A formation method of the source electrode and the drain electrode is not particularly limited and may be appropriately selected depending on the intended purpose. Examples of the formation method include the same formation methods as described for the gate electrode.

An average thickness of the source electrode and the drain electrode is not particularly limited and may be appropriately selected depending on the intended purpose. However, the average thickness of the source electrode and the drain electrode is preferably from 20 nm through 1 µm and more preferably from 50 nm through 300 nm.

<Insulating Layer (Passivation Layer)>

A configuration where an insulating layer (passivation layer) is disposed on at least one selected from the group consisting of the source electrode, the drain electrode, and the active layer is a preferable aspect of the transistor. This insulating layer often plays a role as a so-called passivation layer configured to prevent the source electrode, the drain electrode, and the active layer from changing properties through a direct contact with oxygen and moisture in the atmosphere. Moreover, in a display device using a field-effect transistor, a display element including, for example, an emissive layer may be disposed on the transistor. In that case, this insulating layer may serve as a flattening film, which is configured to absorb level differences derived from a shape of the transistor, to flatten the surface.

A material of the insulating layer is not particularly limited and may be appropriately selected depending on the intended purpose. Examples of the material include materials (e.g., $SiO_2$, SiON, and SiNx) that have been already widely used for mass production and organic materials (e.g., polyimide (PI) and fluororesins).

Figure 2:
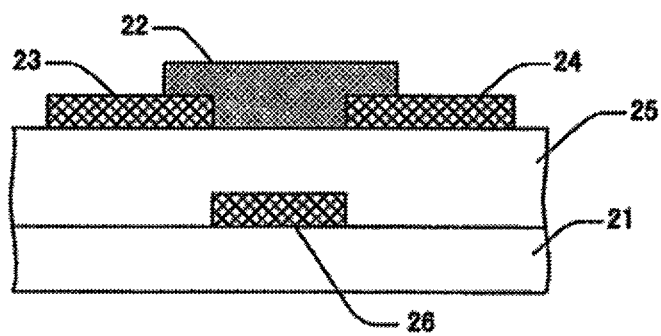
FIG. 2 is a schematic structural view illustrating one example of a bottom contact/bottom gate field-effect transistor.
Figure 3:
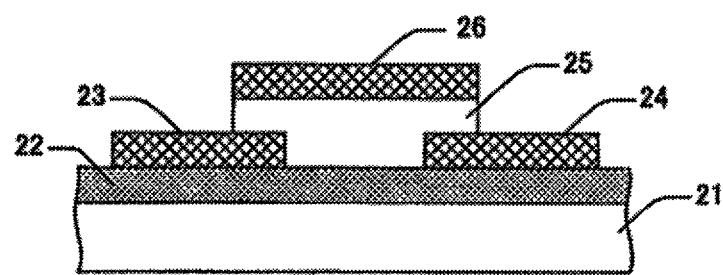
FIG. 3 is a schematic structural view illustrating one example of a top contact/top gate field-effect transistor.
Figure 4:
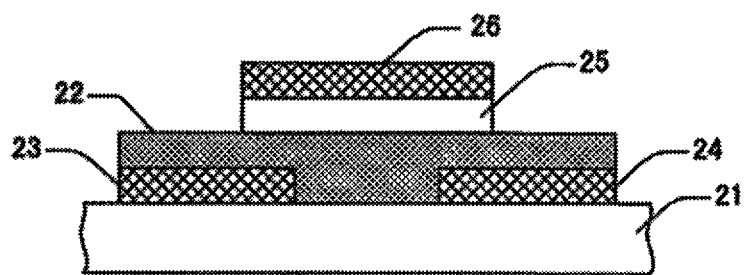
FIG. 4 is a schematic structural view illustrating one example of a bottom contact/top gate field-effect transistor.

A structure of the field-effect transistor is not particularly limited and may be appropriately selected depending on the intended purpose. Examples of the structure of the field-effect transistor include a top contact/bottom gate field-effect transistor (FIG. 1), a bottom contact/bottom gate field-effect transistor (FIG. 2), a top contact/top gate field-effect transistor (FIG. 3), and a bottom contact/top gate field-effect transistor (FIG. 4).

In FIGS. 1 to 4, reference numeral 21 denotes a substrate, reference numeral 22 denotes an active layer, reference numeral 23 denotes a source electrode, reference numeral 24 denotes a drain electrode, reference numeral 25 denotes a gate insulating layer, and reference numeral 26 denotes a gate electrode. The aforementioned insulating layer (passivation layer) is not illustrated in these figures.

The field-effect transistor can suitably be used for display elements described below, but use of the field-effect transistor is not limited to the display elements. For example, the field-effect transistor can be used for IC cards and ID tags.

<Method for Producing Field-Effect Transistor>

One example of the method for producing the field-effect transistor will be described.

First, a gate electrode is formed on a substrate.

A shape, a structure, and a size of the substrate are not particularly limited and may be appropriately selected depending on the intended purpose.

A material of the substrate is not particularly limited and may be appropriately selected depending on the intended purpose. Examples of the material include glass and plastics.

The glass is not particularly limited and may be appropriately selected depending on the intended purpose. Examples of the glass include non-alkali glass and silica glass.

The plastics are not particularly limited and may be appropriately selected depending on the intended purpose. Examples of the plastics include polycarbonate (PC), polyimide (PI), polyethylene terephthalate (PET), and polyethylene naphthalate (PEN).

Note that, pre-treatments, such as oxygen plasma, UV ozone, and UV radiation washing, are preferably performed on the substrate to clean a surface of the substrate and improve adhesiveness.

Subsequently, a gate insulating layer is formed on the gate electrode.

Subsequently, an active layer made of an oxide semiconductor is formed in a channel region and on the gate insulating layer.

Subsequently, a source electrode and a drain electrode are formed on the gate insulating layer to be spaced from each other so as to be across the active layer.

In the above-described manner, the field-effect transistor is produced. According to the above-described production method, for example, a top contact/bottom gate field-effect transistor as illustrated in FIG. 1 is produced.

(Display Element)

A display element of the present disclosure includes at least a light control element and a driving circuit configured to drive the light control element. The display element further includes other members according to the necessity.

<Light Control Element>

The light control element is not particularly limited and may be appropriately selected depending on the intended purpose, so long as the light control element is an element configured to control a light output according to a driving signal. Examples of the light control element include electroluminescent (EL) elements, electrochromic (EC) elements, liquid crystal elements, electrophoretic elements, and electrowetting elements.

<Driving Circuit>

The driving circuit is not particularly limited and may be appropriately selected depending on the intended purpose, so long as the driving circuit includes the field-effect transistor of the present disclosure.

<Other Members>

The other members are not particularly limited and may be appropriately selected depending on the intended purpose.

Because the display element includes the field-effect transistor of the present disclosure, the display element can be driven at high speed and can achieve long service life and low power consumption.

(Image Display Device)

An image display device of the present disclosure includes at least a plurality of display elements, a plurality of wired lines, and a display control device. The image display device further includes other members according to the necessity.

<Plurality of Display Elements>

The plurality of display elements are not particularly limited and may be appropriately selected depending on the intended purpose, so long as the plurality of display elements are the display elements of the present disclosure arranged in a form of matrix.

<Plurality of Wired Lines>

The plurality of wired lines are not particularly limited and may be appropriately selected depending on the intended purpose, so long as the plurality of wired lines are wired lines configured to individually apply gate voltage and signal voltage to the field-effect transistors in the plurality of display elements.

<Display Control Device>

The display control device is not particularly limited and may be appropriately selected depending on the intended purpose, so long as the display control device is a device configured to individually control the gate voltage and the signal voltage of the field-effect transistors via the plurality of wired lines correspondingly to the image data.

<Other Members>

The other members are not particularly limited and may be appropriately selected depending on the intended purpose.

Because the image display device includes the display elements of the present disclosure, variation between the elements can be reduced and high-quality images can be displayed with a large display.

(System)

A system of the present disclosure includes at least the image display device of the present disclosure and an image-data-generating device.

The image-data-generating device is configured to generate image data based on image information to be displayed and to output the image data to the image display device.

Because the system includes the image display device of the present disclosure, image information with high definition can be displayed.

The display element, the image display device, and the system of the present disclosure will next be described with reference to the following drawings.

Figure 5:
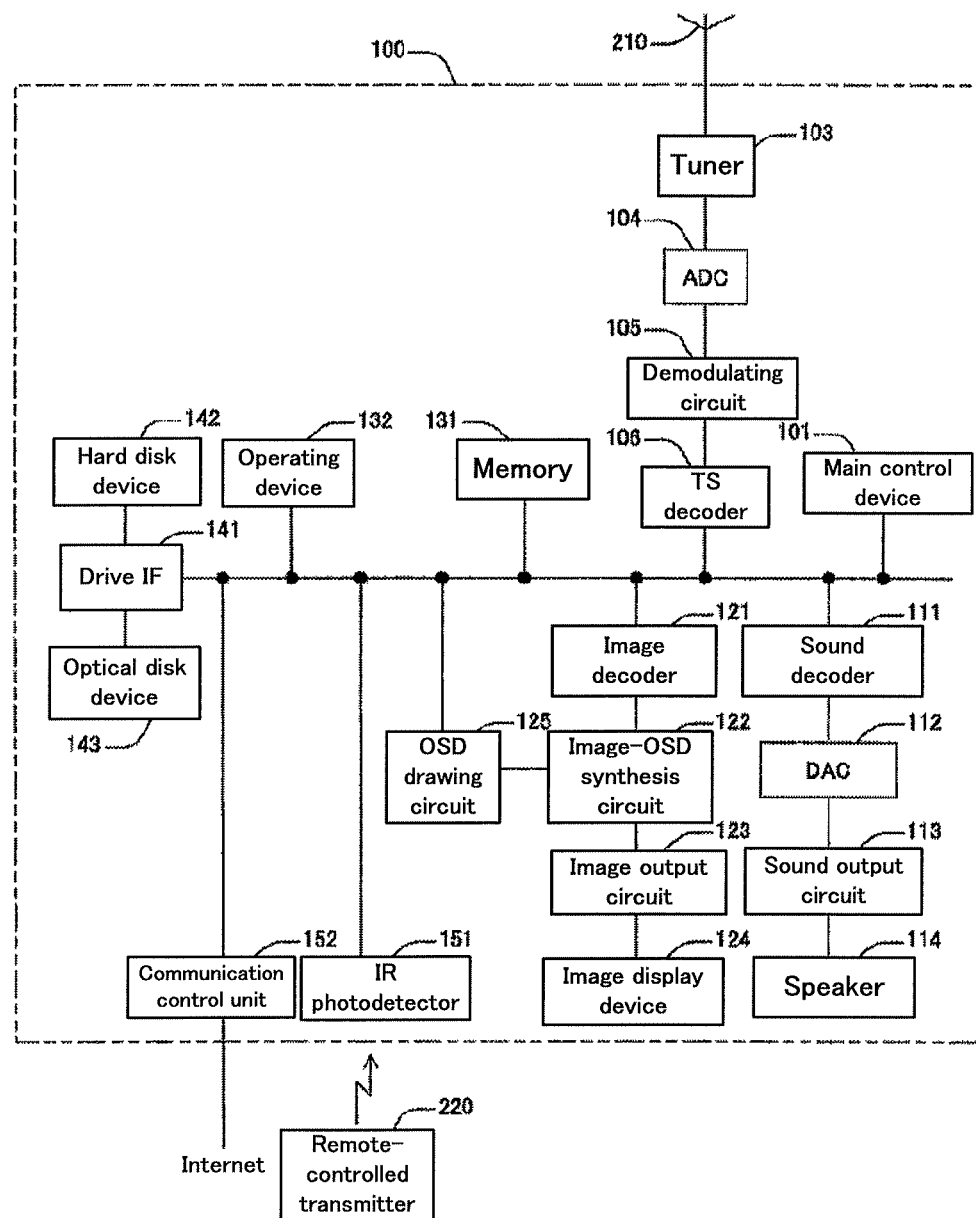
FIG. 5 is a schematic structural diagram illustrating one example of a television device as a system of the present disclosure.

First, a television device is described as the system of the present disclosure with reference to FIG. 5. Note that, the configuration presented in FIG. 5 is one example, and a television device serving as the system of the present disclosure is not limited to the configuration presented in FIG. 5.

In FIG. 5, a television device 100 includes a main control device 101, a tuner 103, an AD converter (ADC) 104, a demodulating circuit 105, a transport stream (TS) decoder 106, a sound decoder 111, a DA converter (DAC) 112, a sound output circuit 113, a speaker 114, an image decoder 121, an image-OSD synthesis circuit 122, an image output circuit 123, an image display device 124, an OSD drawing circuit 125, a memory 131, an operating device 132, a drive interface (drive IF) 141, a hard disk device 142, an optical disk device 143, an IR photodetector 151, and a communication control unit 152.

The image decoder 121, the image-OSD synthesis circuit 122, the image output circuit 123, and the OSD drawing circuit 125 constitute the image-data-generating device.

The main control device 101 includes a CPU, a flash ROM, and a RAM. The main control device 101 is configured to control the entirety of the television device 100.

The flash ROM stores, for example: a program written with a code that can be decoded with the CPU; and various data used in processing with the CPU.

Also, the RAM is a memory for operation.

The tuner 103 is configured to select a pre-set channel from the broadcast waves received by an antenna 210.

The ADC 104 is configured to convert the output signal (analog information) of the tuner 103 into digital information.

The demodulating circuit 105 is configured to demodulate the digital information from the ADC 104.

The TS decoder 106 is configured to TS decode the output signal of the demodulating circuit 105 to separate the output signal into sound information and image information.

The sound decoder 111 is configured to decode the sound information from the TS decoder 106.

The DA converter (DAC) 112 is configured to convert the output signal of the sound decoder 111 into an analog signal.

The sound output circuit 113 is configured to output the output signal of the DA converter (DAC) 112 to the speaker 114.

The image decoder 121 is configured to decode the image information from the TS decoder 106.

The image-OSD synthesis circuit 122 is configured to synthesize an output signal of the image decoder 121 and an output signal of the OSD drawing circuit 125.

The image output circuit 123 is configured to output the output signal of the image-OSD synthesis circuit 122 to the image display device 124.

The OSD drawing circuit 125 includes a character generator configured to display characters or graphics on a screen of the image display device 124. The OSD drawing circuit 125 is configured to generate a signal including display information according to the instructions from the operating device 132 and the IR photodetector 151.

The memory 131 is configured to temporarily store audio-visual (AV) data.

The operating device 132 includes an input medium (not illustrated) such as a control panel. The operating device 132 is configured to inform various information, which has been input by a user, to the main control device 101.

The drive IF 141 is an interactive communication interface. One example of the drive IF 141 is according to AT attachment packet interface (ATAPI).

The hard disk device 142 includes, for example, a hard disk and a driving device configured to drive the hard disk. The driving device is configured to record data on the hard disk and reproduce the data recorded on the hard disk.

The optical disk device 143 is configured to record data on an optical disk (e.g., a DVD) and reproduce the data recorded on the optical disk.

The IR photodetector 151 is configured to receive a photosignal from a remote-controlled transmitter 220 and report the received photosignal to the main control device 101.

The communication control unit 152 is configured to control communication with the Internet. Various kinds of information can be obtained via the Internet.

Figure 6:
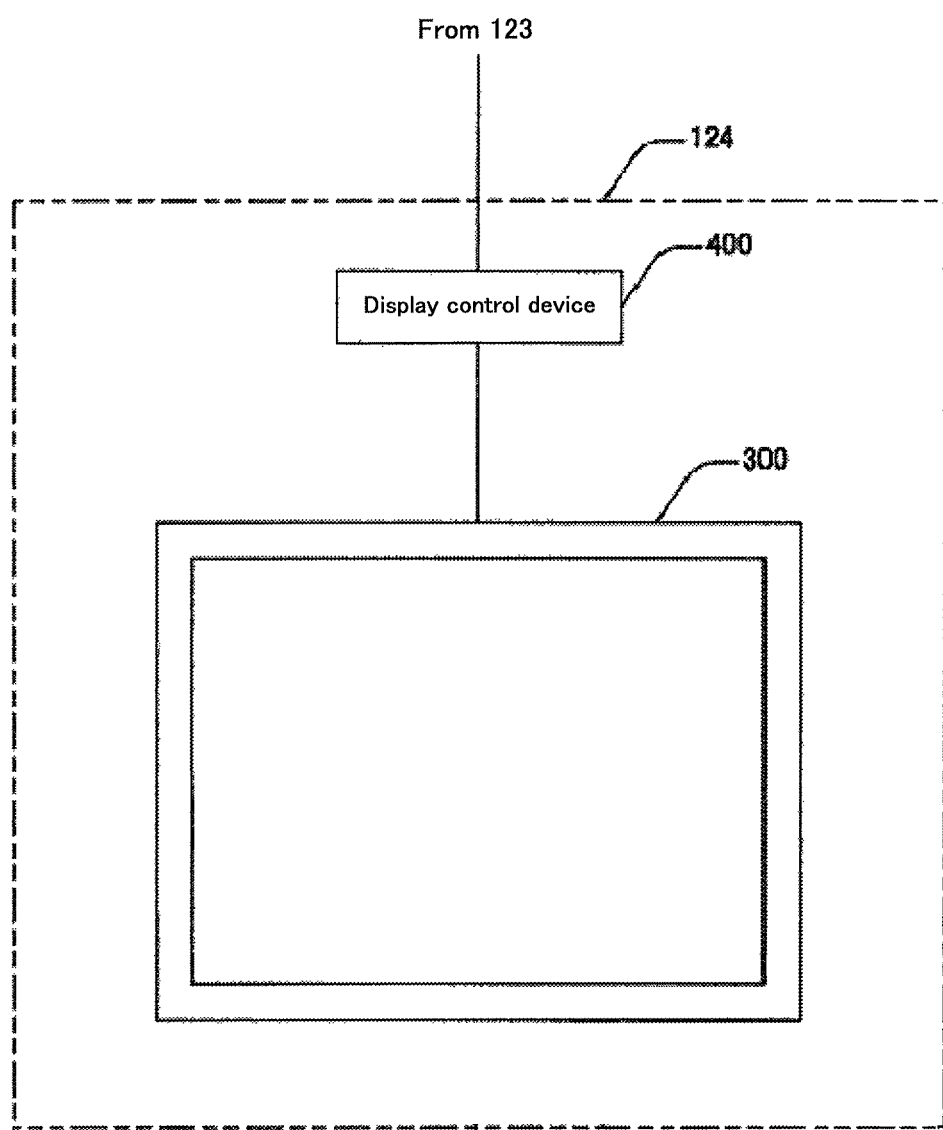
FIG. 6 is a diagram for presenting an image display device in FIG. 5 (part 1)

FIG. 6 is a schematic structural view illustrating one example of the image display device of the present disclosure.

In FIG. 6, the image display device 124 includes a display unit 300 and a display control device 400.

Figure 7:
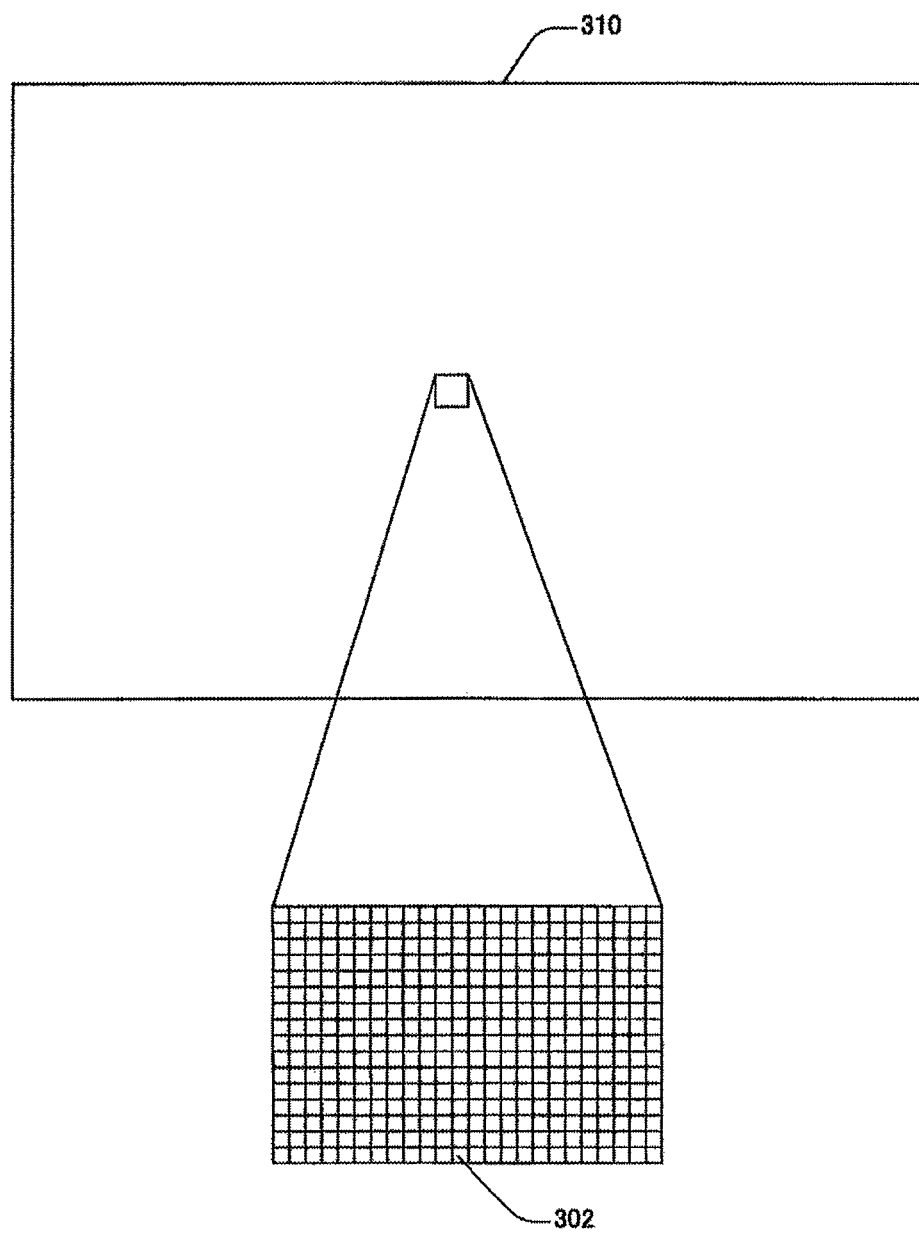
FIG. 7 is a diagram for presenting an image display device in FIG. 5 (part 2)

As illustrated in FIG. 7, the display unit 300 includes a display 310 in which a plurality of display elements 302 are arranged in a form of matrix (the number "n"×the number "m" in FIG. 7).

Figure 8:
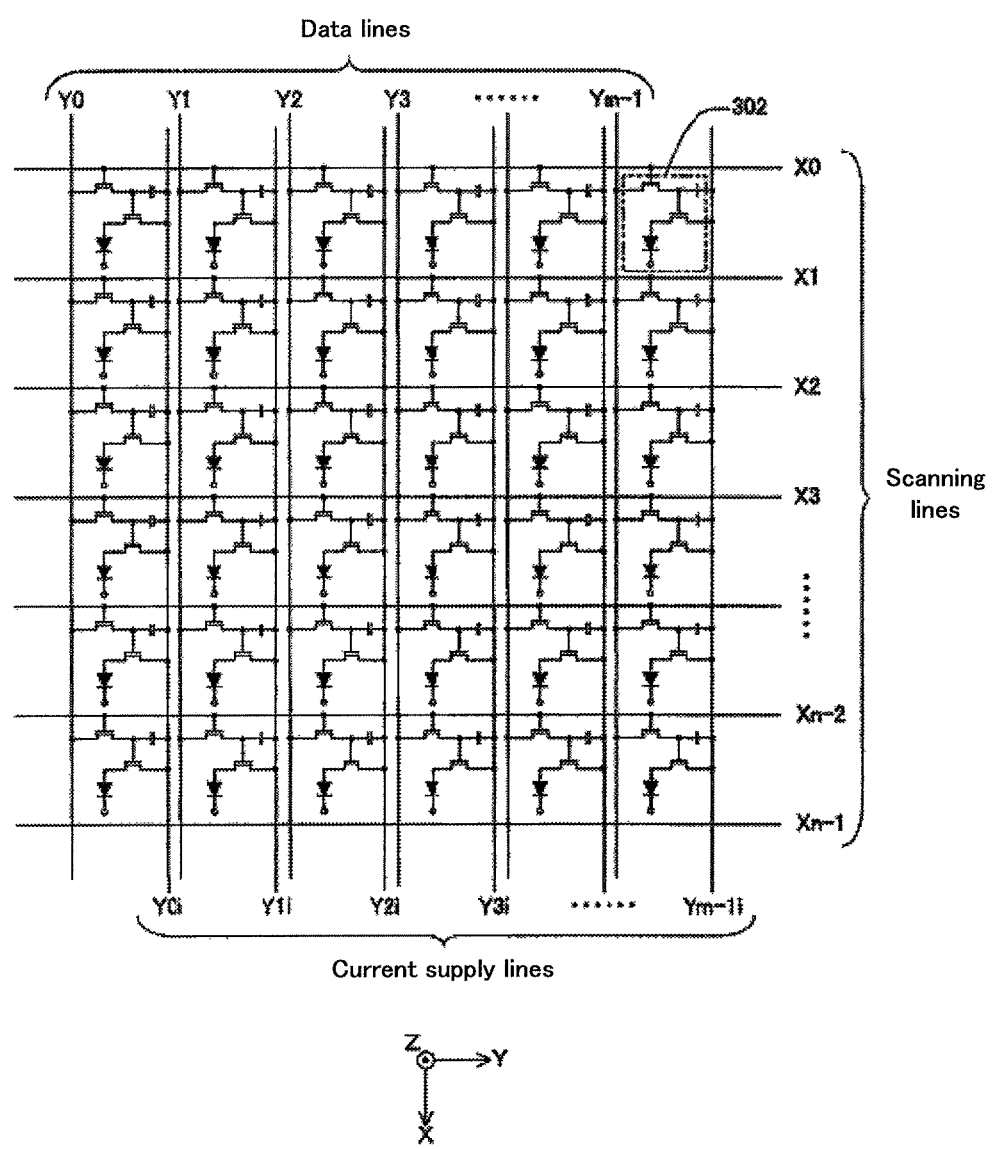
FIG. 8 is a diagram for presenting an image display device in FIG. 5 (part 3)

As illustrated in FIG. 8, the display 310 includes "n" scanning lines (X0, X1, X2, X3, . . . Xn-2, Xn-1) arranged along the X axis direction at constant intervals, "m" data lines (Y0, Y1, Y2, Y3, . . . Ym-1) arranged along the Y axis direction at constant intervals, and "m" current supply lines (Y0$i$, Y1$i$, Y2$i$, Y3$i$, . . . Ym-1$i$) arranged along the Y axis direction at constant intervals.

Each of the display elements can be identified by each of the scanning lines and each of the data lines.

The display element of the present disclosure will be described below with reference to FIG. 9.

Figure 9:
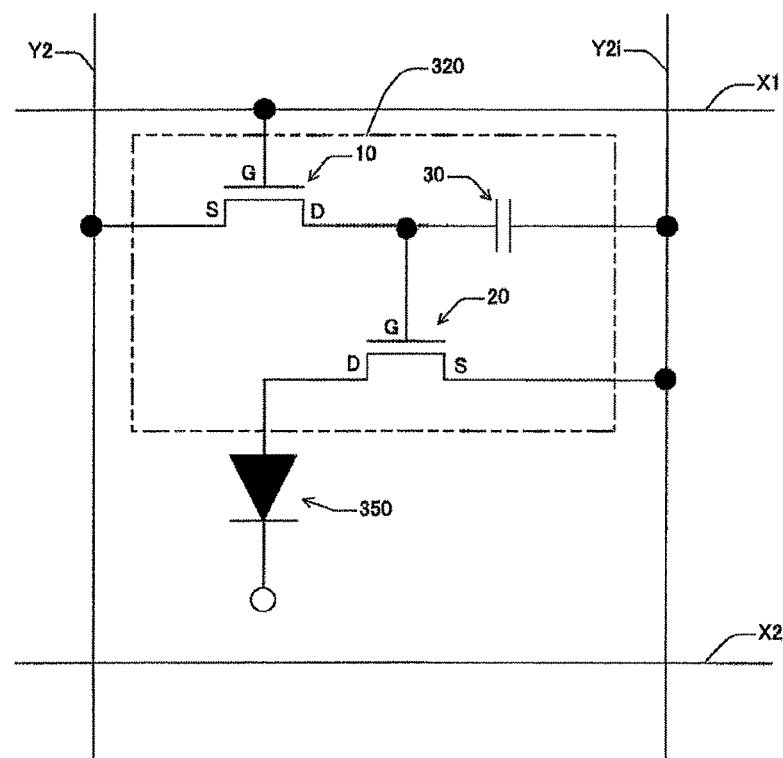
FIG. 9 is a diagram for presenting one example of a display element of the present disclosure.

FIG. 9 is a schematic structural view illustrating one example of the display element of the present disclosure.

As illustrated as one example in FIG. 9, the display element includes an organic electroluminescent (EL) element 350 and a drive circuit 320 configured to allow the organic EL element 350 to emit light. The drive circuit 320 is a current-driven basic circuit of 2Tr-1C, but the drive circuit 320 is not limited to the above-described circuit. Specifically, the display 310 is an organic EL display of a so-called active matrix system.

Figure 10:
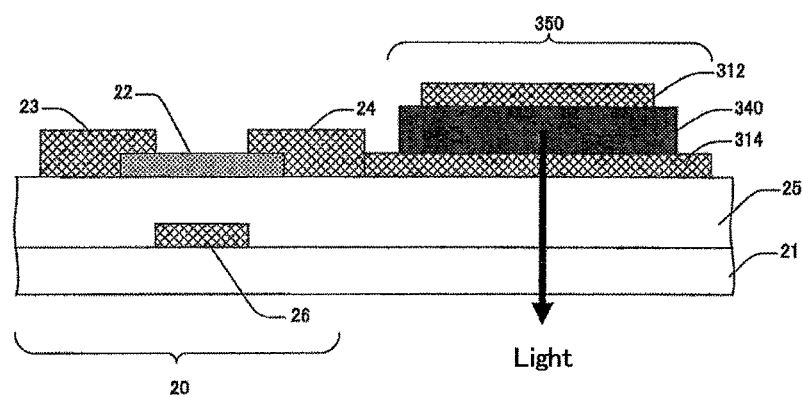
FIG. 10 is a schematic structural view illustrating one example of a positional relationship between an organic EL element and a field-effect transistor in a display element.

One example of a positional relationship between an organic EL element 350 and a field-effect transistor 20 serving as a drive circuit in a display element 302 is illustrated in FIG. 10. In FIG. 10, the organic EL element 350 is disposed next to the field-effect transistor 20. Note that, a field-effect transistor 10 and a capacitor (not illustrated) are also formed on the same substrate.

A passivation film is suitably disposed on or above the active layer 22, although the passivation film is not illustrated in FIG. 10. A material of the passivation film may be appropriately selected from $SiO_2$, SiON, SiNx, $Al_2O_3$, and fluoropolymers.

Figure 11:
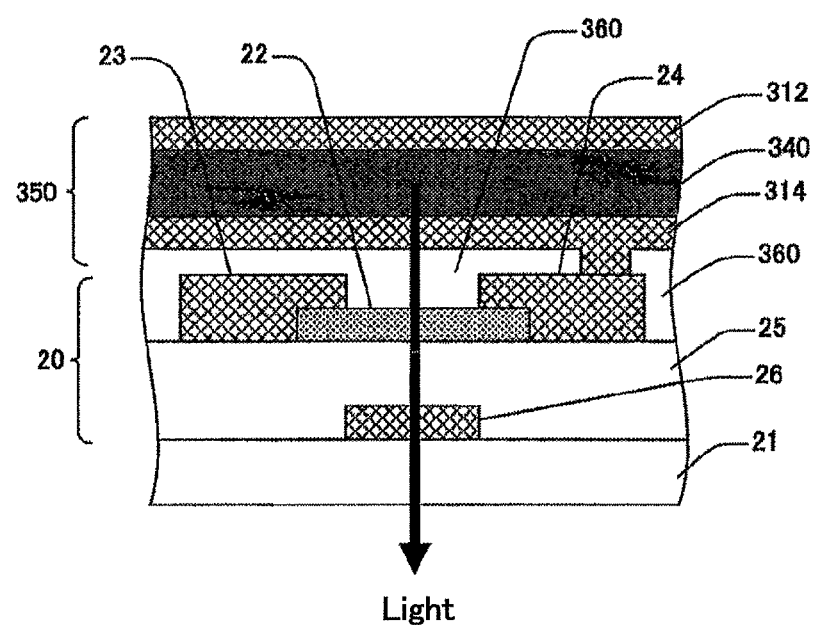
FIG. 11 is a schematic structural view illustrating another example of a positional relationship between an organic EL element and a field-effect transistor in a display element.

As illustrated in FIG. 11, for example, the organic EL element 350 may be disposed on the field-effect transistor 20. In the case of this structure, the gate electrode 26 is required to have transparency. Therefore, a conductive transparent oxide (e.g., ITO, $In_2O_3$, $SnO_2$, ZnO, Ga-added ZnO, Al-added ZnO, and Sb-added $SnO_2$) is used for the gate electrode 26. Note that, reference numeral 360 is an interlayer insulating film (a leveling film). Polyimide or acrylic resins can be used for the interlayer insulating film.

Figure 12:
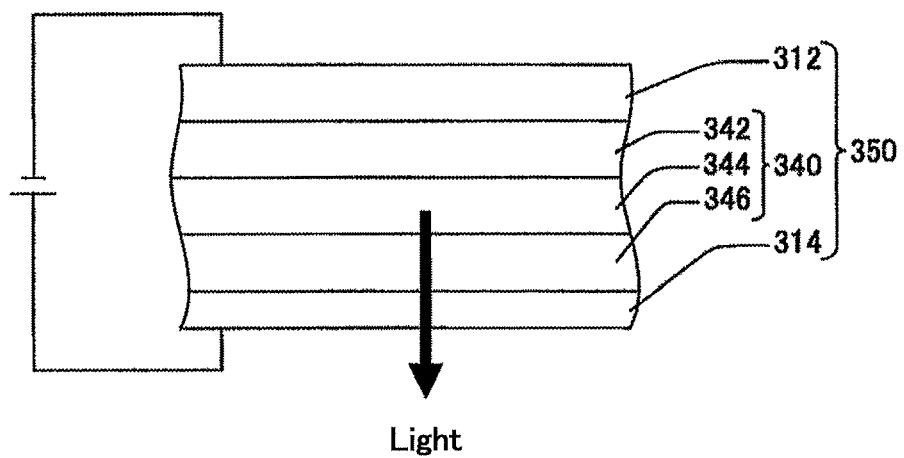
FIG. 12 is a schematic structural view illustrating one example of an organic EL element.

FIG. 12 is a schematic structural view illustrating one example of an organic EL element.

In FIG. 12, the organic EL element 350 includes a cathode 312, an anode 314, and an organic EL thin film layer 340.

A material of the cathode 312 is not particularly limited and may be appropriately selected depending on the intended purpose. Examples of the material include aluminium (Al), magnesium (Mg)-silver (Ag) alloy, aluminium (Al)-lithium (Li) alloy, and indium tin oxide (ITO). Note that, the magnesium (Mg)-silver (Ag) alloy becomes a high-reflective electrode if having a sufficient thickness, and an extremely thin film (less than about 20 nm) of the Mg—Ag alloy becomes a semi-transparent electrode. In FIG. 12, light is taken out from the side of the anode. However, light can be taken out from the side of the cathode when the cathode is a transparent electrode or a semi-transparent electrode.

A material of the anode 314 is not particularly limited and may be appropriately selected depending on the intended purpose. Examples of the material include indium tin oxide (ITO), indium zinc oxide (IZO), and silver (Ag)-neodymium (Nd) alloy. Note that, in a case where a silver alloy is used, the resultant electrode becomes a high-reflective electrode, which is suitable for taking light out from the side of the cathode.

The organic EL thin film layer 340 includes an electron transporting layer 342, a light emitting layer 344, and a hole transporting layer 346. The electron transporting layer 342 is coupled to a cathode 312 and the hole transporting layer 346 is coupled to an anode 314. The light emitting layer 344 emits light when a predetermined voltage is applied between the anode 314 and the cathode 312.

The electron transporting layer 342 and the light emitting layer 344 may form a single layer. Moreover, an electron injecting layer may be disposed between the electron transporting layer 342 and the cathode 312. Furthermore, a hole injecting layer may be disposed between the hole transporting layer 346 and the anode 314.

The above-described organic EL element is a so-called "bottom emission" organic EL element, in which light is taken out from the side of the substrate. However, the organic EL element may be a "top emission" organic EL element, in which light is taken out from the opposite side to the substrate.

The driving circuit 320 in FIG. 9 will be described.

The drive circuit 320 includes two field-effect transistors 10 and 20 and a capacitor 30.

The field-effect transistor 10 serves as a switching element. A gate electrode G of the field-effect transistor 10 is coupled to a predetermined scanning line and a source electrode S of the field-effect transistor 10 is coupled to a predetermined data line. Moreover, a drain electrode D of the field-effect transistor 10 is coupled to one terminal of the capacitor 30.

The field-effect transistor 20 is configured to supply electric current to the organic EL element 350. The gate electrode G of the field-effect transistor 20 is coupled to the drain electrode D of the field-effect transistor 10. The drain electrode of the field-effect transistor 20 is coupled to the anode 314 of the organic EL element 350 and a source electrode S of the field-effect transistor 20 is coupled to a predetermined current supply line.

The capacitor 30 is configured to memorize the state of the field-effect transistor 10; i.e., data. The other terminal of the capacitor 30 is coupled to a predetermined current supply line.

When the field-effect transistor 10 turns into the state of "on", image data are stored in the capacitor 30 via the signal line Y2. Even after turning the field-effect transistor 10 into the state of "off", the organic EL element 350 is driven by maintaining the "on" state of the field-effect transistor 20 corresponding to the image data.

Figure 13:
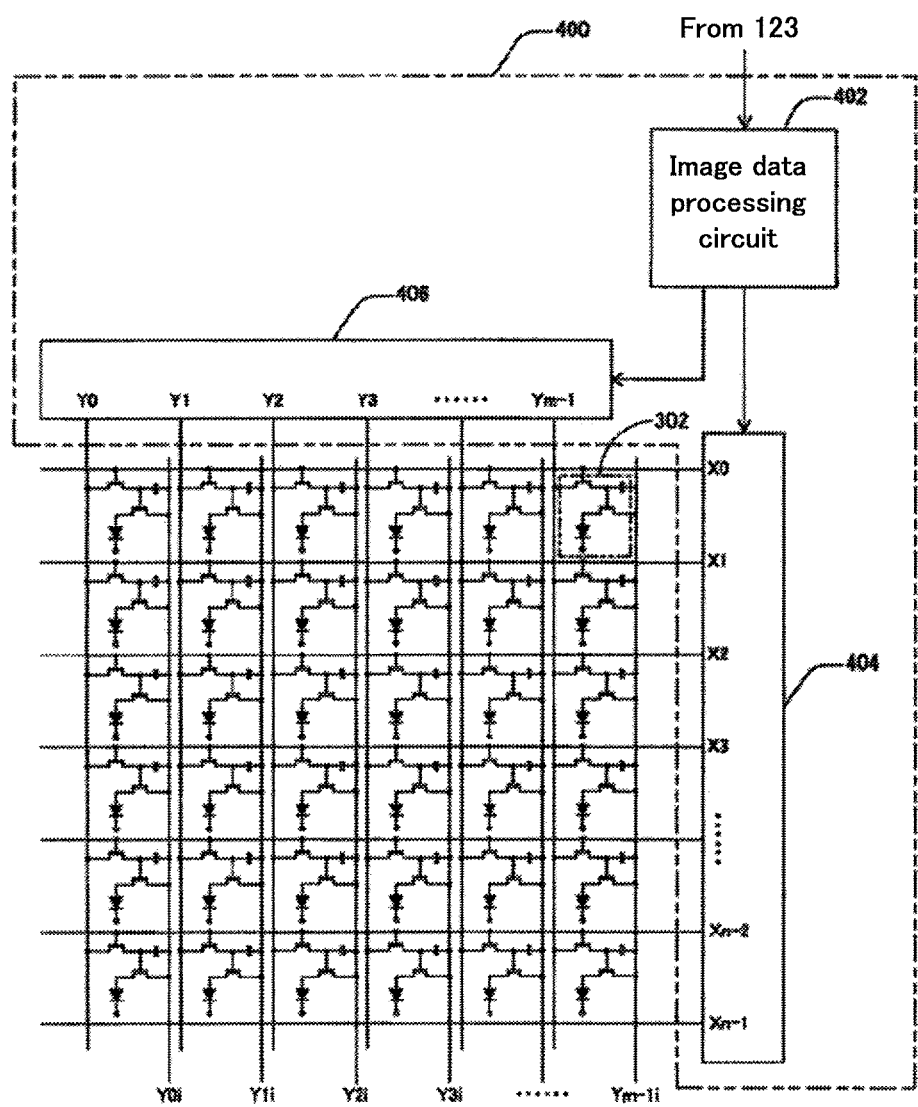
FIG. 13 is a diagram for presenting a display control device.

FIG. 13 is a schematic structural view illustrating another example of the image display device of the present disclosure.

In FIG. 13, the image display device includes display elements 302, wired lines (including scanning lines, data lines, and current supply lines), and a display control device 400.

The display control device 400 includes an image-data-processing circuit 402, a scanning-line-driving circuit 404, and a data-line-driving circuit 406.

The image-data-processing circuit 402 determines brightness of a plurality of display elements 302 in the display based on output signals of an image output circuit 123.

The scanning-line-driving circuit 404 individually applies voltage to "n" scanning lines according to the instructions of the image-data-processing circuit 402.

The data-line-driving circuit 406 individually applies voltage to "m" data lines according to the instructions of the image-data-processing circuit 402.

In the above embodiment, a case where the light control element is an organic EL element has been described, but the present disclosure is not limited to the above. For example, the light control element may be an electrochromic element. In this case, the display is an electrochromic display.

Figure 14:
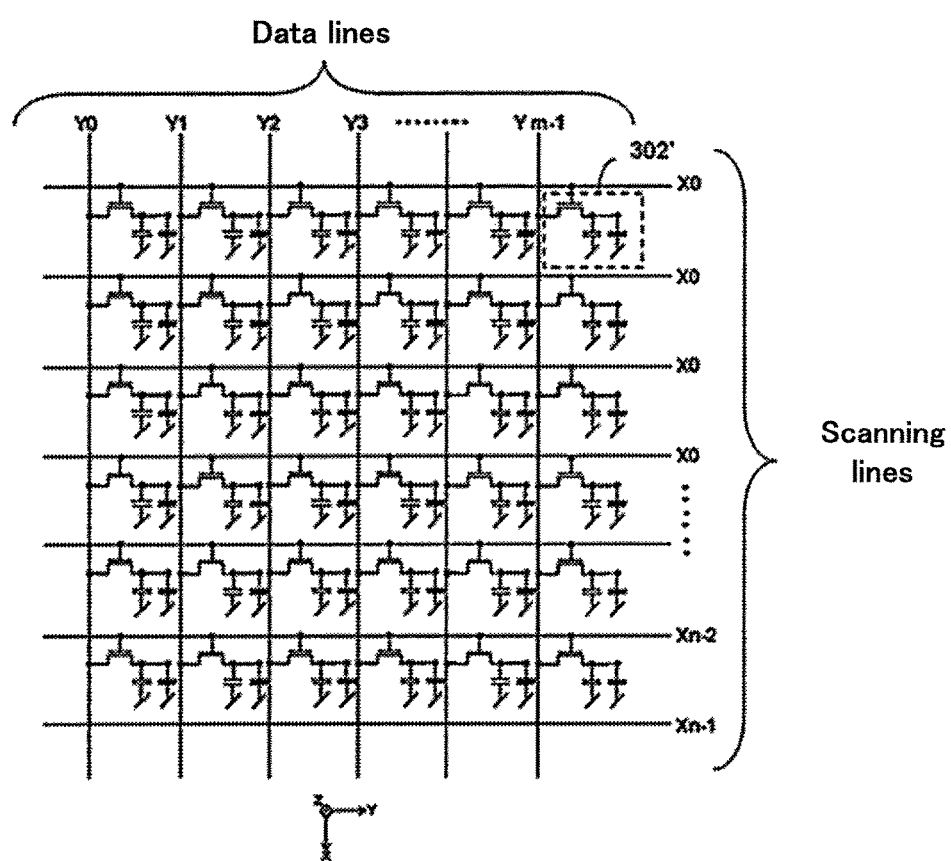
FIG. 14 is a diagram for presenting a liquid crystal display.
Figure 15:
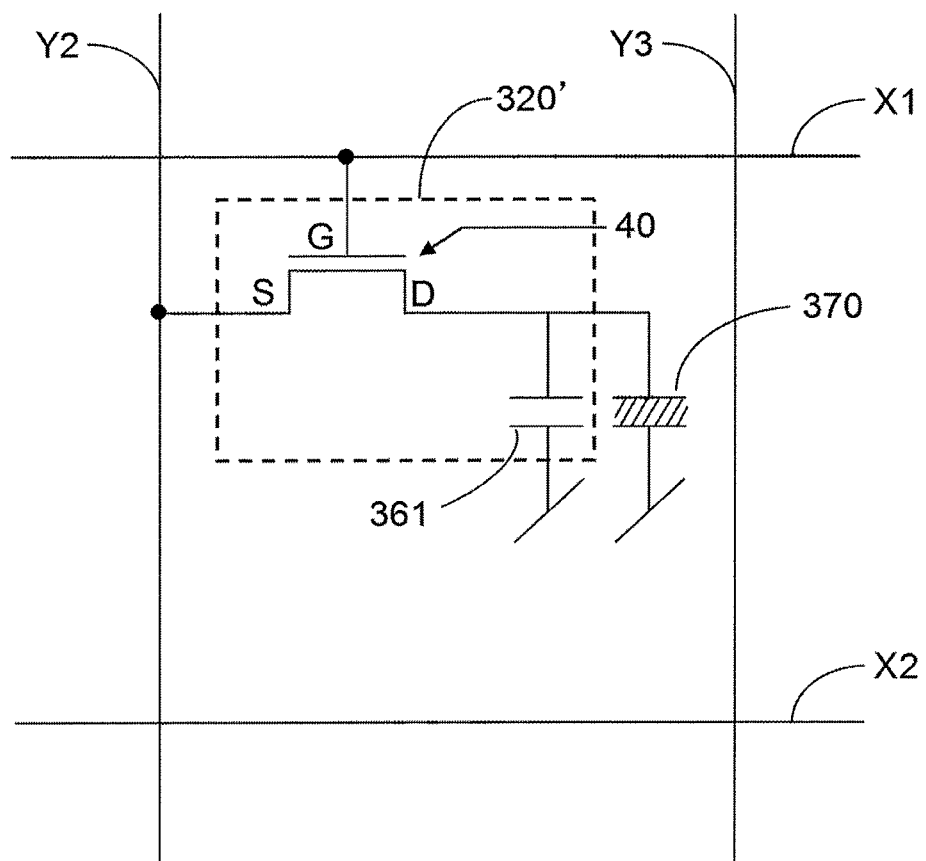
FIG. 15 is a diagram for presenting a display element in FIG. 14.

The light control element may be a liquid crystal element. In this case, the display is a liquid crystal display. As illustrated in FIG. 14, it is not necessary to provide a current supply line for a display element 302'. As illustrated in FIG. 15, the drive circuit 320' may be produced with one field-effect transistor 40, which is similar to each of the field-effect transistors 10 and 20. In the field-effect transistor 40, a gate electrode G is coupled to a predetermined scanning line and a source electrode S is coupled to a predetermined data line. Moreover, a drain electrode D is coupled to a capacitor 361 and a pixel electrode of a liquid crystal element 370.

The light control element may be an electrophoretic element, an inorganic EL element, or an electrowetting element.

As described above, a case where the system of the present disclosure is a television device has been described, but the system of the present disclosure is not limited to the television device. The system is not particularly limited so long as the system includes the image display device 124 as a device for displaying images and information. For example, the system may be a computer system in which a computer (including a personal computer) is coupled to the image display device 124.

The image display device 124 can be used as a display unit in mobile information devices (e.g., mobile phones, portable music players, portable video players, electronic books, personal digital assistants (PDAs)) and camera devices (e.g., still cameras and video cameras). The image display device 124 can also be used for display units for various information in transportation systems (e.g., cars, aircraft, trains, and ships). Furthermore, the image display device 124 can be used for display units for various information in measuring devices, analysis devices, medical equipment, and advertising media.

EXAMPLES

The present disclosure will next be described by way of Examples, but the Examples should not be construed to limit the present disclosure in any way.

Example 1

<Production of Field-Effect Transistor>
—Formation of Gate Electrode—
Al film was formed through a vacuum deposition method on a glass substrate so as to have a thickness of 100 nm and the resultant Al film was patterned into lines by photolithography to form a gate electrode.
—Formation of Gate Insulating Layer—
La(thd)$_3$ and Ba(thd)$_2$ (thd=2,2,6,6-tetramethyl-3,5-heptanedionato) were respectively dissolved in tetraethylene glycol dimethyl ether (tetraglyme) and tetrahydrofuran (THF) to prepare liquid raw materials. The liquid raw materials were deposited on a glass substrate containing the gate electrode through CVD to form a La—Ba oxide insulating film having a thickness of about 100 nm. The La—Ba oxide insulating film was defined as a gate insulating layer. A ratio between the number of La atoms and the number of Ba atoms in the oxide insulating film (La:Ba) is 9:1.
—Formation of Active Layer—
An argon (Ar) gas and an oxygen (O$_2$) gas were introduced into a chamber. A sintered body target of MgIn$_2$O$_4$ was used to perform DC sputtering at room temperature (without temperature control) to form a film of MgIn$_2$O$_4$ serving as an active layer. A ratio of oxygen in the amount of the gases introduced into the chamber during formation of the film was 1.0% relative to the total amount (the total amount of the argon gas and the oxygen gas). Patterning was performed by forming the film through a metal mask. Subsequently, using an oven, a heat treatment was performed in the atmosphere at 300° C. for 1 hour. This annealing treatment is generally performed in order to improve transistor characteristics by reducing level density of interfacial defects between an active layer and a gate insulating layer.
—Formation of Source Electrode and Drain Electrode—
A source electrode and a drain electrode, each having a thickness of 100 nm, were formed on the gate insulating layer and the active layer through a vacuum deposition method. Al was used for a deposition source. Patterning was performed through a metal mask to form a film. A channel width was set to 200 μm and a channel length was 50 μm. Subsequently, in order to improve electric contact between the active layer and the source•drain electrodes, a heat treatment was performed at 200° C. for 1 hour in the atmosphere using an oven.

Through the above process, a top contact•bottom gate field-effect transistor similar to the field-effect transistor presented in FIG. 1 was obtained.
<Measurement of Carrier Density of Active Layer>
In order to produce an element for Hall measurement, a film of MgIn$_2$O$_4$ was formed on another glass substrate under the same conditions as in the formation of active layer. A shadow mask was used for sputtering to form patterns having a square of 8 mm. Subsequently, contact electrodes for Hall measurement were formed on four corners of the film of MgIn$_2$O$_4$ using a shadow mask through a vacuum deposition method. Al was used for a deposition source.

A density of electron carriers (/cm³) of the film of MgIn$_2$O$_4$ was determined by measuring the element for Hall measurement for both specific resistance and Hall effect using a Hall effect measurement system (available from TOYO Corporation, RESITEST 8300). The result was 5.7×10$^{17}$/cm³.

<Measurement of Dielectric Constant of Gate Insulating Layer>

In order to produce an element for measuring dielectric constant, Al was deposited on another glass substrate to form a bottom electrode. Then, a La—Ba oxide insulating film was formed in the same manner as in the formation of gate insulating layer. Subsequently, Al was deposited thereon to form an upper electrode. A shadow mask was used to form a desired pattern in each of the film formations to obtain a condenser having an area of 0.5 mm². The condenser was measured for capacity to calculate dielectric constant. The dielectric constant at a frequency of 1 kHz was 11.8.

<Measurement of Crystallinity of Gate Insulating Layer>

Figure 16:
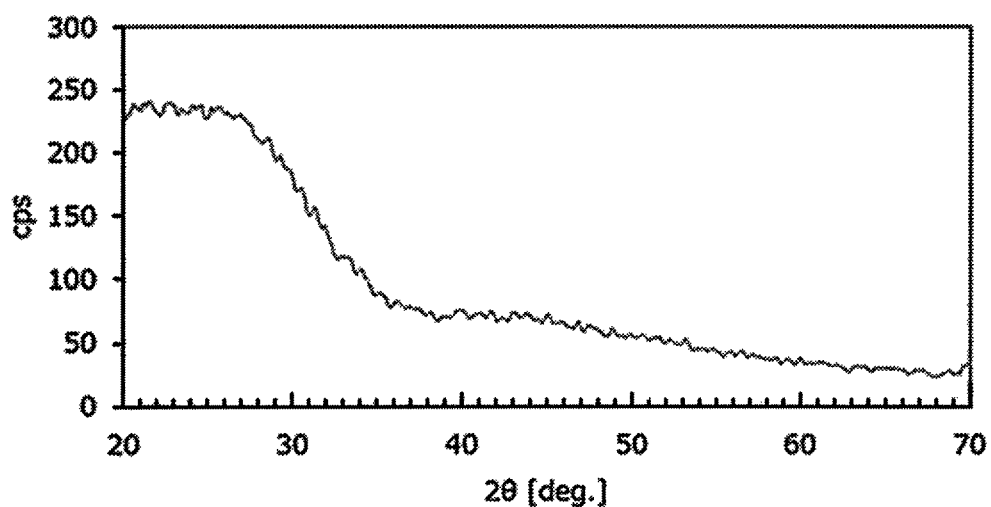
FIG. 16 is a graph presenting measurement results of X-ray diffraction of a gate insulating layer of Example 1.

In order to perform an experiment on X-ray diffraction, a La—Ba oxide insulating film was formed on another glass substrate under the same conditions as in the formation of gate insulating layer. Subsequently, the La—Ba oxide insulating film was subjected to both a heat treatment at 300° C. for 1 hour and a heat treatment at 200° C. for 1 hour so as to undergo the same heat history as the gate insulating layer of the transistor. The results obtained by measuring the film for X-ray diffraction using X'Pert-PRO (available from Philips) were presented in FIG. 16. The X-rays used were Cu—Kα rays (wavelength: 1.5405 angstroms). No diffraction peak was exhibited and thus the gate insulating layer was found to be an amorphous oxide film.

<Measurement of Transistor Characteristics>

The obtained field-effect transistor was evaluated for transistor performances using a semiconductor parameter analyzer (semiconductor parameter analyzer 4156C, available from Agilent Technologies). Electric current (Ids) between the source and the drain was measured by changing gate voltage (Vg) from −15 V through +15 V with voltage (Vds) between the source and the drain being 10 V to evaluate transfer characteristics (Vg-Ids characteristics). The results are presented in FIG. 17. Subsequently, the Vg was changed from +15 V through −15 V to measure the Ids. The obtained transfer characteristics overlapped with FIG. 17 and no hysteresis was exhibited. Absolute values of the gate current (Ig) was also presented in FIG. 17. It was found that leakage current was sufficiently low of 0.1 pA or less.

Figure 17:
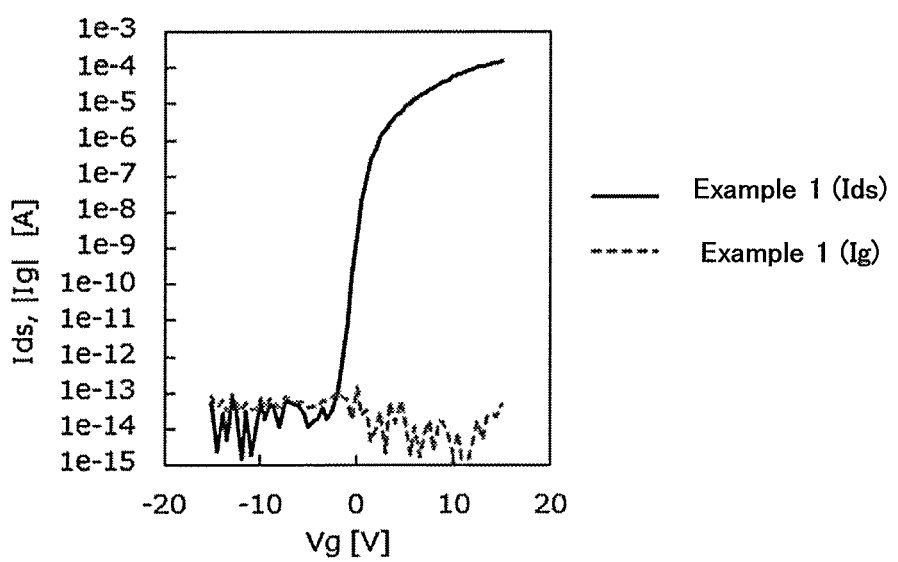
FIG. 17 is a graph presenting transfer characteristics of Example 1.

Based on the transfer characteristics presented in FIG. 17, field-effect mobility (μ) was calculated in a saturated region. Moreover, an on/off ratio of the Ids was calculated. The Ids in an on-state was a value obtained when the Vg was 15 V. The Ids in an off-state was an average value of Ids when the Vg was in the range of from −15 V through −10 V. A subthreshold swing (SS) (difference of gate voltages necessary to increase the Ids by one digit), which exhibits a degree of rapid rising from the off-state to the on-state, was calculated. The results are presented in Table 1.

Here, in the tables and the figures, "e" and "E" denote the exponent of 10. That is, "1e-3" and "1E-3" denote "1.0×10$^{-3}$", and "1e-10" and "1E-10" denote "1.0×10$^{-10}$".

Comparative Example 1

A field-effect transistor was produced in the same manner as in Example 1 except that the method for forming a gate insulating layer was changed as described below.

—Formation of Gate Insulating Layer—

A film of SiO$_2$ having a thickness of 200 nm was formed, through a RF sputtering method, on the grass substrate on which the gate electrode was disposed. The film was defined as a gate insulating layer. A SiO$_2$ glass target was used as a sputtering target. An argon gas and an oxygen gas were introduced into a chamber during the formation of the film. An amount of the oxygen gas was set to 25.0%. Moreover, the dielectric constant of the film of SiO$_2$ was 3.9 when the dielectric constant was measured in the same manner as in Example 1.

<Measurement of Transistor Characteristics>

Figure 18:
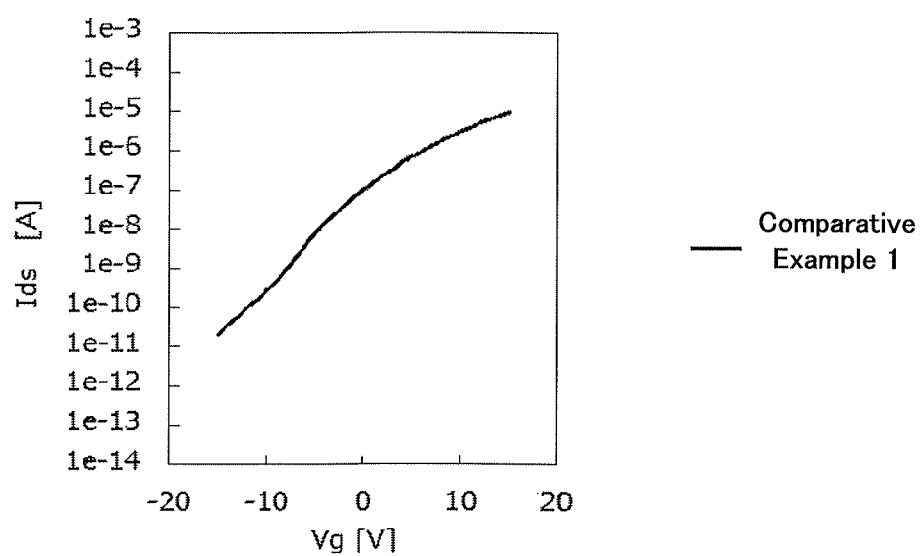
FIG. 18 is a graph presenting transfer characteristics of Comparative Example L

The transistor characteristics were evaluated in the same manner as in Example 1. The transfer characteristics of Comparative Example 1 are presented in FIG. 18. The calculated values of the field-effect mobility and the on/off ratio are presented in Table 1. Here, the calculation was performed provided that a value of the off-current is Ids obtained when Vg was −15 V. Moreover, a subthreshold swing of Comparative Example 1 was unknown because a clear off-state was not exhibited and rising cannot be defined in an intended measurement range (Vg=from −15 V through +15 V).

Comparative Example 2

A field-effect transistor was produced in the same manner as in Example 1 except that the method for forming a gate insulating layer was changed as described below.

—Formation of Gate Insulating Layer—

A film of SiON having a thickness of 200 nm was formed on the glass substrate on which the gate electrode was disposed through plasm CVD using a SiH$_4$ gas and a N$_2$O gas at a temperature of 200° C. This film was defined as "gate insulating layer". When the film of SiON was measured for dielectric constant in the same manner as in Example 1, the dielectric constant was 7.0.

<Measurement of Transistor Characteristics>

Figure 19:
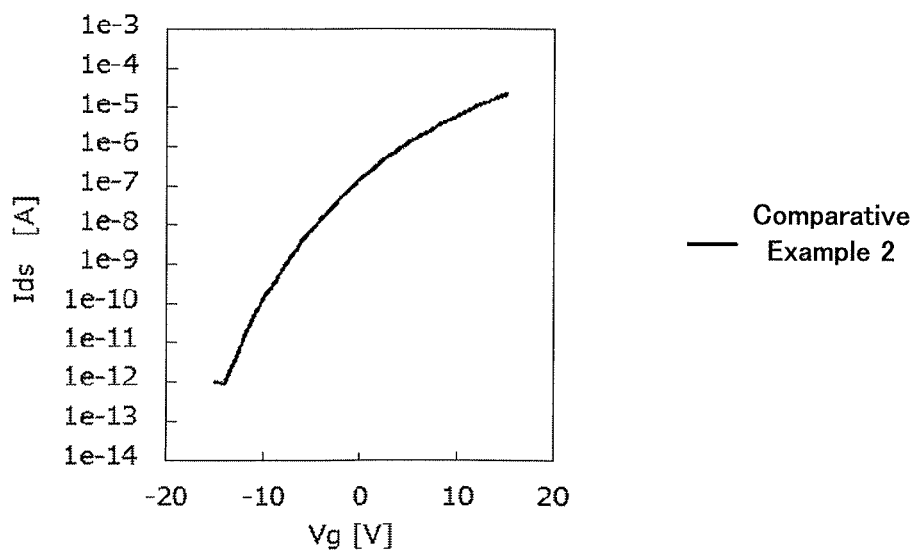
FIG. 19 is a graph presenting transfer characteristics of Comparative Example 2.

The transistor characteristics were evaluated in the same manner as in Example 1. The transfer characteristics of Comparative Example 2 are presented in FIG. 19. The calculated values of the field-effect mobility, the on/off ratio, and the subthreshold swing are presented in Table 1. Here, calculation was performed provided that a value of the off-current is Ids obtained when Vg was −15 V.

Comparative Example 3 and Comparative Example 4

A field-effect transistor was produced in the same manner as in Comparative Example 1 except that the method for forming an active layer was changed as described below (Comparative Example 3).

A field-effect transistor was produced in the same manner as in Comparative Example 2 except that the method for forming an active layer was changed as described below (Comparative Example 4).

—Formation of Active Layer—

An argon (Ar) gas and an oxygen (O$_2$) gas were introduced into a chamber. A sintered body target of MgIn$_2$O$_4$ was used to perform DC sputtering at room temperature (without temperature control) to form a film of MgIn$_2$O$_4$ serving as an active layer. A ratio of oxygen in the amount of the gases introduced into the chamber during formation of the film was 40.0% relative to the total amount. Patterning was performed by forming the film through a metal mask. Subsequently, using an oven, a heat treatment was performed in the atmosphere at 300° C. for 1 hour. When a carrier density of the film of MgIn$_2$O$_4$ was determined in the same manner as in Example 1, the carrier density was 7.51×10$^{16}$/cm$^3$.

<Measurement of Transistor Characteristics>

Transistor properties were each evaluated in the same manner as in Example 1. The transfer characteristics of Comparative Example 3 are presented in FIG. 20, and the transfer characteristics of Comparative Example 4 are presented in FIG. 21. The calculated values of the field-effect mobility, the on/off ratio, and the subthreshold swing are presented in Table 1.

Comparative Example 5

A field-effect transistor was produced in the same manner as in Example 1 except that the method for forming a gate insulating layer was changed as described below.

—Formation of Gate Insulating Layer—

An yttrium 2-ethylhexanoate toluene solution (amount of Y: 8 wt %) (11 mL) and a calcium 2-ethylhexanoate mineral spirit solution (amount of Ca: 5 wt %) (0.4 mL) were mixed with toluene (12 mL) to obtain a coating liquid for forming an yttrium-calcium oxide insulating film. A ratio between Y atoms and Ca atoms in the coating liquid (Y:Ca) is 10:0.5.

Figure 22:
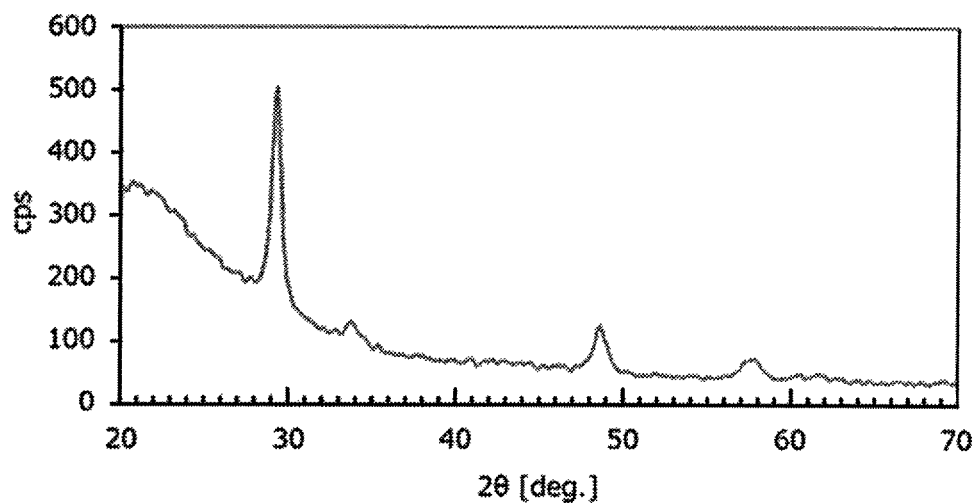
FIG. 22 is a graph presenting measurement results of X-ray diffraction of a gate insulating layer of Comparative Example 5.

The coating liquid was spin-coated on the glass substrate on which the gate electrode had been disposed. The coating liquid on the glass substrate was dried using an oven at 120° C. for 1 hour in the atmosphere. Then, the coating liquid was baked at 400° C. for 3 hours in an oxygen atmosphere to form a gate insulating layer. An average thickness of the gate insulating layer was 105 nm. When the film was measured for dielectric constant in the same manner as in Example 1, the dielectric constant was 11.4. The results obtained by measuring the film for X-ray diffraction in the same manner as in Example 1 were presented in FIG. 22. Peaks were observed when 2θ is about 29 degrees, about 34 degrees, about 48.5 degrees, and about 58 degrees, which correspond to (2,2,2), (4,0,0), (4,4,0), and (6,2,2) diffraction peaks of yttria (Y$_2$O$_3$) having a fluorite structure. That is, it was found that a polycrystalline yttria was present in this film.

<Measurement of Transistor Characteristics>

Figure 23:
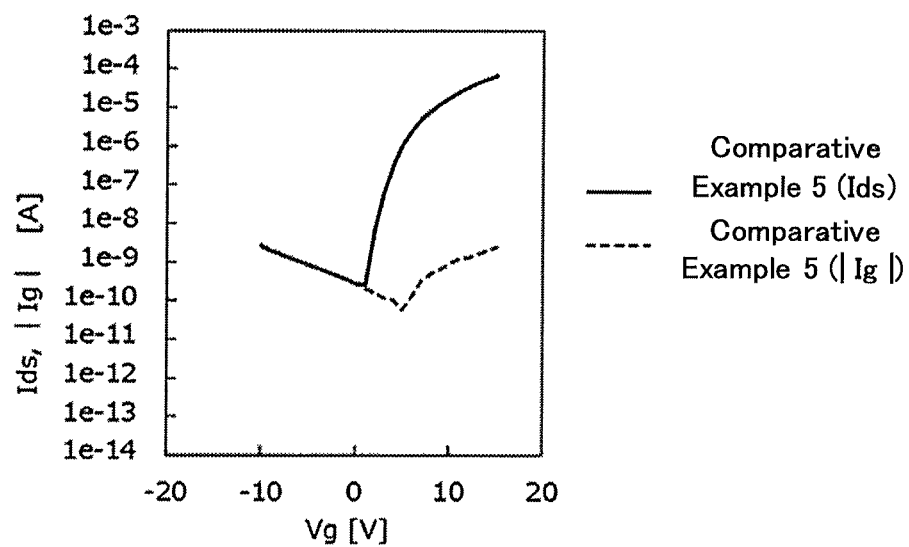
FIG. 23 is a graph presenting transfer characteristics of Comparative Example 5.

The transistor characteristics were evaluated in the same manner as in Example 1. The transfer characteristics were presented in FIG. 23. Moreover, values of the gate•leakage current were also presented in FIG. 23. The calculated values of the field-effect mobility, the on/off ratio, and the subthreshold swing are presented in Table 1.

In Example 1, the active layer had a carrier density of 5.73×10$^{17}$/cm$^3$, whereas a La—Ba oxide insulating film (La—Ba film) was incorporated into the gate insulating layer. The La—Ba film has high dielectric constant of 11.8. In this case, the obtained transistor achieved favorable switching property, and achieved high mobility of 5.33 cm$^2$/Vs. The off-current and the gate•leakage current were considerably low values of 0.1 pA or less, and no hysteresis was exhibited in the transfer characteristics. Therefore, it is believed that this amorphous La—Ba film makes it possible to form a paraelectric gate insulating layer excellent in insulating property. The on/off ratio is more than 10$^9$, which is a sufficiently favorable property in terms of practical applications. The subthreshold swing exhibiting a degree of rapid rising was a sufficiently small value of 0.39 V/decade.

In Comparative Example 1, the active layer has the carrier density similar to the active layer of Example 1, whereas SiO$_2$ is incorporated into the gate insulating layer. Regarding the transfer characteristics, it can be confirmed that the Ids is changed in response to the Vg, but no clear off-state is observed within the range of from −15 V through 15 V. Even when the maximum value and the minimum value of the Ids were used to obtain a value corresponding to the on/off ratio, the obtained value was only 10$^5$ digits. Therefore, the subthreshold swing could not be calculated due to unclear rising.

In Comparative Example 2, the active layer has the carrier density similar to the active layer of Example 1, whereas SiON is incorporated into the gate insulating layer. The transfer characteristics showed clear depletion-mode operation, which means that rising starts from large negative voltage. Although the off-state is found, the value of the off-current is relatively high (i.e., unit of the obtained off-current is pA). The on/off ratio is 10$^7$ digits and is smaller by 2 digits compared to the value of Example 1. The obtained subthreshold swing is a large value of 1.54 V/decade.

Figure 20:
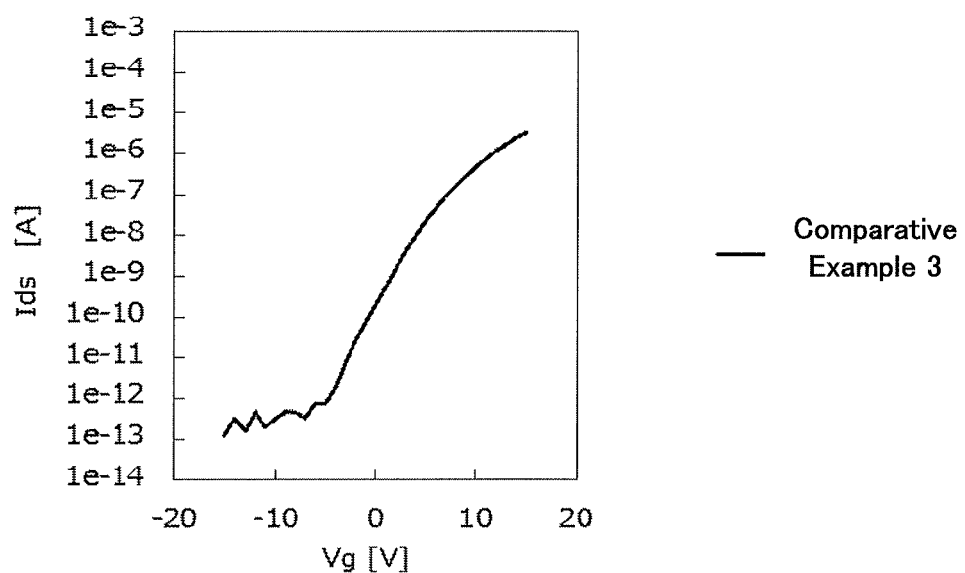
FIG. 20 is a graph presenting transfer characteristics of Comparative Example 3.
Figure 21:
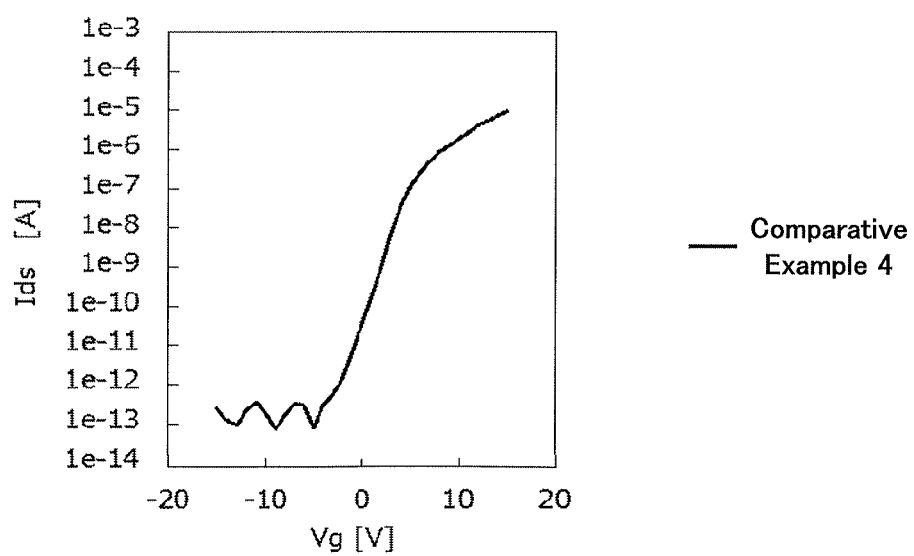
FIG. 21 is a graph presenting transfer characteristics of Comparative Example 4.

The gate insulating layer includes a SiO$_2$ film in Comparative Example 3, whereas the gate insulating layer includes a SiON film in Comparative Example 4. Comparative Example 1 is different from Comparative Example 2 in terms of carrier density of the active layer. A carrier density of the Comparative Example 1 is lowered by increasing the amount of oxygen during the film formation of the active layer. Reduction in carriers makes the rising voltage move toward the direction of plus. Even when the gate insulating layer is formed of SiO$_2$, the off-state can be found in Comparative Example 3 (FIG. 20). However, compared to

TABLE 1

| Nos. | Carrier density of semiconductor [/cm$^3$] | Dielectric constant of gate insulating layer | Mobility [cm$^2$/Vs] | On/off ratio | Subthreshold swing [V/decade] |
| --- | --- | --- | --- | --- | --- |
| Example 1 | 5.73E+17 | 11.8 | 5.33 | 5.69E+09 | 0.39 |
| Comparative Example 1 | 5.73E+17 | 3.9 | 3.01 | 4.80E+05 | Unknown |
| Comparative Example 2 | 5.73E+17 | 7.0 | 4.36 | 2.19E+07 | 1.54 |
| Comparative Example 3 | 7.51E+16 | 3.9 | 2.44 | 1.28E+07 | 1.16 |
| Comparative Example 4 | 7.51E+16 | 7.0 | 2.82 | 4.69E+07 | 1.12 |
| Comparative Example 5 | 5.73E+17 | 11.4 | 3.36 | 1.54E+05 | 0.70 |

Here, in Table 1, "E" denotes the exponent of 10. Specifically, "1E+5" denotes "100,000".

Example 1 (FIG. 17), there is an obvious difference in terms of a degree of rapid rising, and the subthreshold swings of Comparative Example 3 and Comparative Example 4 are both more than 1 V/decade. Therefore, it cannot be said that the transistors of Comparative Example 3 and Comparative Example 4 have characteristics sufficient for practical applications.

In Comparative Example 5, the gate insulating layer included an oxide film including Ca and Y. The insulating layer had high percentage of the Y oxide and it was found that, from results of X-ray diffraction presented in FIG. 22, a polycrystal of $Y_2O_3$ was present in the film. The active layer of Comparative Example 5 was formed under the same conditions as in Example 1 and had the same carrier density as in Comparative Example 5. Regarding the transfer characteristics presented in FIG. 23, the value of the off-current is higher and the on/off ratio is a smaller value of $10^5$ digits compared to Example 1 (FIG. 17). The value of the off-current matches the value of the gate•leakage current presented in the same figure. Therefore, it is found that leakage generated via the gate insulating layer increases the off-current. That is, the Ca—Y oxide film of the gate insulating layer is not amorphous but polycrystalline and thus gate leakage attributed to the crystal grain boundary occurs, resulting in deterioration of transistor characteristics.

In terms of practical applications, characteristics required for the transistor are different depending on applications, but specific characteristics are described as follows. The mobility is generally 1 $cm^2$/Vs or more, more preferably 5 $cm^2$/Vs or more. The on/off ratio is $10^6$ or more, more preferably $10^7$ or more, still more preferably $10^8$ or more. The subthreshold swing is 1 V/decade or less, more preferably 0.5 V/decade or less. The transistor of Example 1 satisfies the above conditions, whereas the transistor of Comparative Example 1 has insufficient characteristics.

Comparative Examples 6 and 7 and Examples 2 to 5

Each field-effect transistor was produced in the same manner as in Example 1 except that the method for forming a gate insulating layer and the method for forming an active layer were changed in the following manner.

—Formation of Gate Insulating Layer—

La(thd)$_3$ and Mg(thd)$_2$ (thd=2,2,6,6-tetramethyl-3,5-heptanedionato) were respectively dissolved in tetraethylene glycol dimethyl ether (tetraglyme) and tetrahydrofuran (THF) to prepare liquid raw materials. The liquid raw materials were deposited to form a La—Mg oxide insulating film having a thickness of about 100 nm through CVD. The La—Mg oxide insulating film was defined as a gate insulating film. A ratio between the number and La atoms to the number of Mg atoms in the oxide insulating film is that La:Mg=8:2. When the film was measured for dielectric constant in the same manner as in Example 1, the dielectric constant was 8.1. When X-ray diffraction was measured in the same manner as in Example 1, no peak was exhibited. Therefore, the film was found to be amorphous.

—Formation of Active Layer—

Indium nitrate (In(NO$_3$)$_3$· 3H$_2$O) (35.488 g) was weighed and was dissolved in ethylene glycol monomethyl ether (100 mL) to obtain liquid A.

Zirconium chloride (ZrCl$_4$) (2.330 g) was weighed and was dissolved in ethylene glycol monomethyl ether (100 mL) to obtain liquid B.

Tungsten chloride (WCl$_6$) (3.965 g) was weighed and was dissolved in ethylene glycol monomethyl ether (100 mL) to obtain liquid C.

The liquid A, the liquid B, the liquid C, ethylene glycol monomethyl ether, and 1,2-propane diol were mixed in amounts presented in Table 2 and stirred at room temperature to prepare the coating liquids of Comparative Examples 6 and 7 and Examples 2 to 5 for forming an oxide semiconductor film.

Next, the coating liquid for forming an oxide semiconductor film was coated on a desired portion on the gate insulating layer through an inkjet method and was baked at 400° C. for 1 hour in the atmosphere to form an active layer.

Under the conditions of Comparative Example 6, an InZrO film is formed by coating the coating liquid on the substrate and baking the coating liquid. A ratio between the number of In atoms and the number of Zr atoms is 100:5. Addition of Zr makes it possible to suppress generation of oxygen vacancies. In Comparative Example 7 and Examples 2 to 5, In (positively trivalent) in the In$_2$Zn$_2$O$_5$ film, which is a mother phase, partially undergoes substitutional doping with W (positively hexavalent) to generate carriers. A W concentration was defined as a percentage of the substituted W relative to the total sites of In. Moreover, in the same manner as in Example 1, these films were measured for carrier density by the Hall measurement. The results are presented in Table 2. As the W concentration increases, the carrier density increases. Therefore, it was found that carriers were effectively generated due to substitutional doping with W.

<Measurement of Transistor Characteristics>

Figure 24:
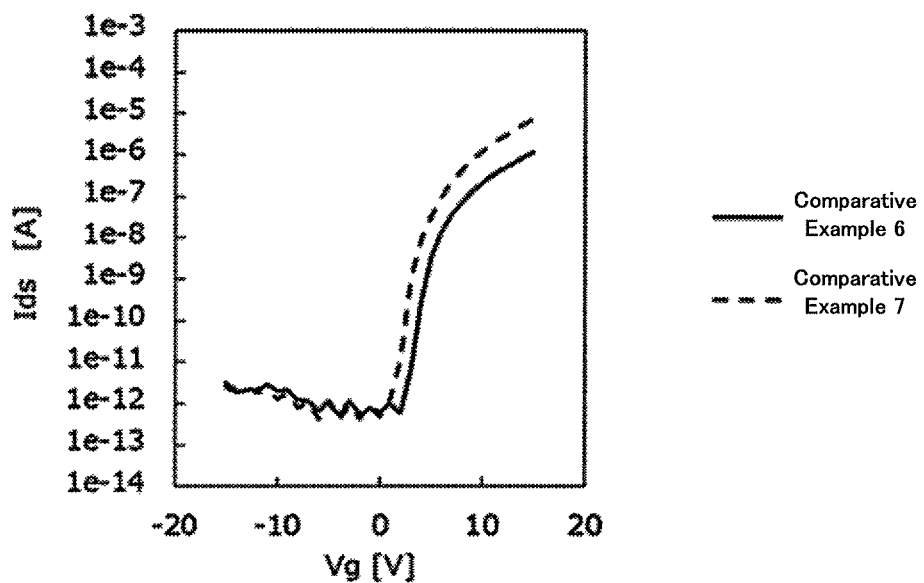
FIG. 24 is a graph presenting transfer characteristics of Comparative Examples 6 and 7.

The transistor characteristics were evaluated in the same manner as in Example 1. The transfer characteristics of Comparative Examples 6 and 7 are presented in FIG. 24, and the transfer characteristics of Examples 2 to 5 are presented in FIG. 25. The calculated values of the field-effect mobility, the on/off ratio, and the subthreshold swing are presented in Table 3. In each of the Comparative Examples 6 and 7 and Examples 2 to 5, no hysteresis was exhibited in the transfer characteristics.

Figure 25:
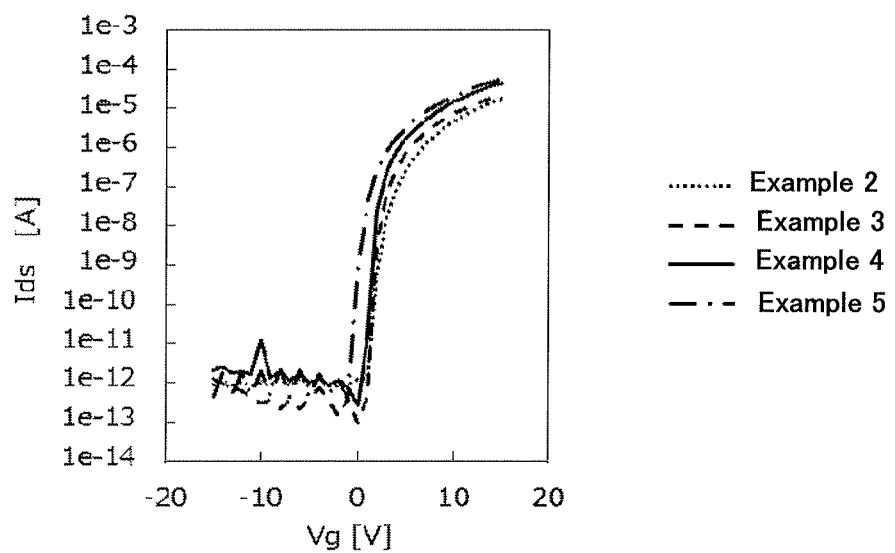
FIG. 25 is a graph presenting transfer characteristics of Examples 2 to 5.

In Comparative Examples 6 and 7 and Examples 2 to 5, all of the gate insulating layers have films having the same formulation, but all of the active layers have different carrier densities. In Comparative Example 6 and Comparative Example 7 where each carrier density is $4.0 \times 10^{17}$/cm$^3$ or less, each mobility is 1 cm$^2$/Vs or less, each on/off ratio is $10^7$ or less, and each subthreshold swing is 0.5 V/decade or more. As is clear from the transfer characteristics of FIG. 24, the transistors of Comparative Examples 6 and 7 have poor switching behavior. Meanwhile, in Examples 2 to 5 where each carrier density is $4.0 \times 10^{17}$/cm$^3$ or more, each mobility is 1 cm$^2$/Vs or more, each on/off ratio is $10^7$ or more, and each subthreshold swing is 0.5 V/decade or less. Therefore, the transistors of Examples 2 to 5 can achieve favorable switching property of rapid rising of the Ids from the off-state to the on-state (FIG. 25). In terms of improvement in mobility, it is found that the carrier density is particularly preferably $1.0 \times 10^{18}$/cm$^3$ or more.

TABLE 2

|  | Liquid A [mL] | Liquid B [mL] | Liquid C [mL] | Ethylene glycol monomethyl ether [mL] | 1,2-Propane diol [mL] | W concentration [%] | Carrier density of semiconductor [/cm$^3$] | Dielectric constant of gate insulating layer |
|---|---|---|---|---|---|---|---|---|
| Comparative Example 6 | 100.0 | 50.0 | 0.0 | 60.0 | 210.0 | 0.0 | 6.90E+16 | 8.1 |
| Comparative Example 7 | 99.8 | 50.0 | 2.0 | 58.2 | 210.0 | 0.2 | 2.31E+17 | 8.1 |
| Example 2 | 99.6 | 50.0 | 4.0 | 56.4 | 210.0 | 0.4 | 4.19E+17 | 8.1 |
| Example 3 | 99.4 | 50.0 | 6.0 | 54.6 | 210.0 | 0.6 | 6.22E+17 | 8.1 |
| Example 4 | 99.0 | 50.0 | 10.0 | 51.0 | 210.0 | 1.0 | 1.02E+18 | 8.1 |
| Example 5 | 98.0 | 50.0 | 20.0 | 42.0 | 210.0 | 2.0 | 1.85E+18 | 8.1 |

TABLE 3

| Nos. | Carrier density of semiconductor [/cm$^3$] | Dielectric constant of gate insulating layer | Mobility [cm$^2$/Vs] | On/off ratio | Subthreshold swing [V/decade] |
|---|---|---|---|---|---|
| Comparative Example 6 | 6.90E+16 | 8.1 | 0.17 | 5.15E+05 | 0.61 |
| Comparative Example 7 | 2.31E+17 | 8.1 | 0.85 | 3.28E+06 | 0.51 |
| Example 2 | 4.19E+17 | 8.1 | 1.37 | 1.93E+07 | 0.37 |
| Example 3 | 6.22E+17 | 8.1 | 1.27 | 3.29E+07 | 0.26 |
| Example 4 | 1.02E+18 | 8.1 | 2.42 | 1.28E+07 | 0.32 |
| Example 5 | 1.85E+18 | 8.1 | 2.82 | 5.20E+07 | 0.29 |

Examples 6 to 11

Each field-effect transistor was produced in the same manner as in Example 4 except that the method for forming a gate insulating layer was changed as described below.
—Formation of Gate Insulating Layer—
Toluene, a lanthanum 2-ethylhexnoate toluene solution (amount of La: 7 wt %) and a magnesium 2-ethylhexanoate toluene solution (amount of Mg: 3 wt %) were mixed in amounts presented in Table 4 to obtain a coating liquid for forming a gate insulating layer.

Figure 26:
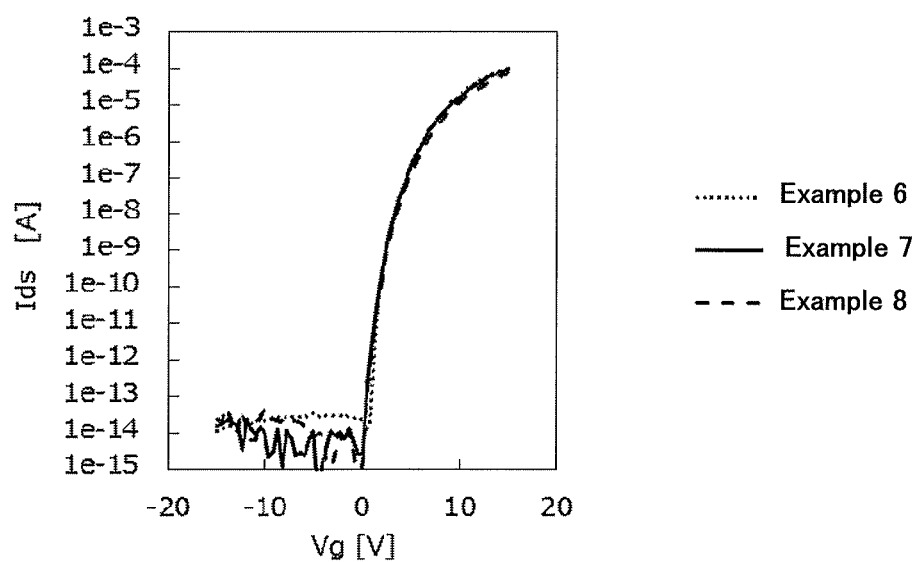
FIG. 26 is a graph presenting transfer characteristics of Examples 6 to 8.

The coating liquid was subjected to spin coating on the glass substrate on which the gate electrode was disposed, and was dried using an oven at 120° C. for 1 hour in the atmosphere. Then, the coating liquid was baked at 400° C. for 3 hours in an oxygen atmosphere to form a gate insulating layer formed of the La—Mg oxide insulating film. A ratio between the number of La atoms and the number of Mg atoms in the oxide film is presented in Table 4. An average thickness of the gate insulating layer was 120 nm. The film was measured for dielectric constant in the same manner as in Example 1. The results are presented in Table 4. When X-ray diffraction was measured in the same manner as in Example 1, no peak was exhibited. Therefore, the film was found to be amorphous.
<Measurement of Transistor Characteristics>
The transistor characteristics were evaluated in the same manner as in Example 1. The transfer characteristics of Examples 6 to 8 are presented in FIG. 26, and the transfer characteristics of Examples 9 to 11 are presented in FIG. 27. The calculated values of the field-effect mobility, the on/off ratio, and the subthreshold swing are presented in Table 5. In each of the Examples, no hysteresis was exhibited in the transfer characteristics.

Figure 27:
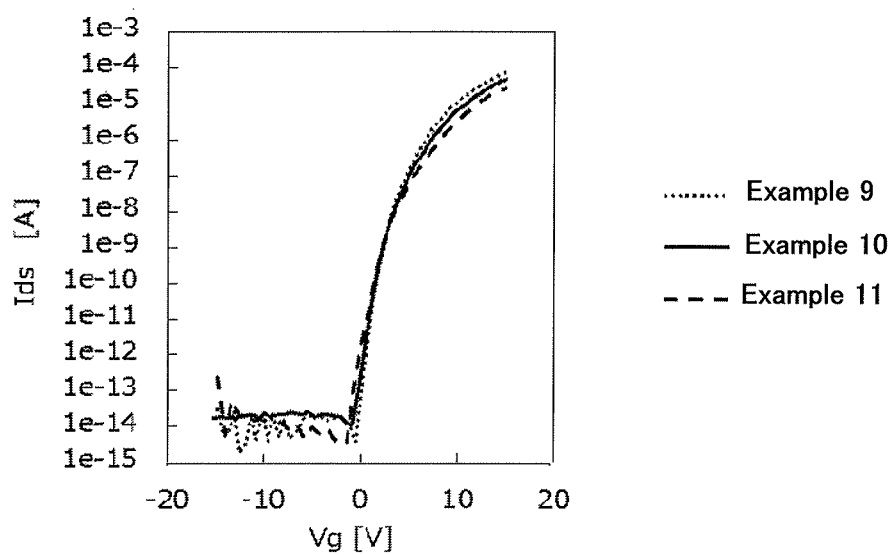
FIG. 27 is a graph presenting transfer characteristics of Examples 9 to 11.

In all of the Examples 6 to 11, sufficiently favorable properties are obtained in terms of practical applications. As seen from the tendencies of the transistor characteristics in cases where the formulation of the gate insulating layer was changed so as to reduce dielectric constant, it was found that when dielectric constant was reduced, a tendency to increase the subthreshold swing could be confirmed. In particular, when the dielectric constant is 7.0 or less, it is clearly found that gradients of transfer curves of rising tend to be gradual (FIG. 27). Therefore, it is found that when the oxide active layer having a carrier density of $4.0 \times 10^{17}/cm^3$ or more is used, the gate insulating layer preferably has a dielectric constant of more than 7.0.

TABLE 4

|  | Toluene [mL] | La 2-Ethylhexanoate toluene solution [mL] | Mg 2-Ethylhexanoate toluene solution [mL] | La:Mg | Dielectric constant |
|---|---|---|---|---|---|
| Example 6 | 20.2 | 18.9 | 0.9 | 8.9:1.1 | 9.1 |
| Example 7 | 21.1 | 17.5 | 1.4 | 8.2:1.8 | 8.3 |
| Example 8 | 22.1 | 15.9 | 2.0 | 7.5:2.5 | 7.7 |
| Example 9 | 23.1 | 14.2 | 2.7 | 6.7:3.3 | 7.2 |
| Example 10 | 24.4 | 12.1 | 3.5 | 5.7:4.3 | 6.9 |
| Example 11 | 25.8 | 9.8 | 4.4 | 4.6:5.4 | 6.2 |

TABLE 5

| Nos. | Carrier density of semiconductor [/cm$^3$] | Dielectric constant of gate insulating layer | Mobility [cm$^2$/Vs] | On/off ratio | Subthreshold swing [V/decade] |
|---|---|---|---|---|---|
| Example 6 | 1.02E+18 | 9.1 | 12.21 | 4.71E+09 | 0.19 |
| Example 7 | 1.02E+18 | 8.3 | 12.12 | 8.03E+09 | 0.28 |

TABLE 5-continued

| Nos. | Carrier density of semiconductor [/cm$^3$] | Dielectric constant of gate insulating layer | Mobility [cm$^2$/Vs] | On/off ratio | Subthreshold swing [V/decade] |
|---|---|---|---|---|---|
| Example 8 | 1.02E+18 | 7.7 | 11.37 | 3.06E+09 | 0.25 |
| Example 9 | 1.02E+18 | 7.2 | 14.18 | 6.40E+09 | 0.35 |
| Example 10 | 1.02E+18 | 6.9 | 8.61 | 8.09E+09 | 0.46 |
| Example 11 | 1.02E+18 | 6.2 | 7.12 | 3.56E+09 | 0.49 |

Examples 12 to 20

A field-effect transistor was produced in the same manner as in Example 1 except that the method for forming a gate insulating layer and the method for forming an active layer were changed as described below.
—Preparation of Coating Liquid for Forming Gate Insulating Layer—

Example 12

Gallium acetylacetonato (0.37 mg) was dissolved in toluene (10 mL). To the resultant solution, a barium 2-ethylhexanoate toluene solution (amount of Ba: 8 wt %) (1.7 mL) was added and mixed to obtain a coating liquid for forming a barium-gallium oxide insulating film. A ratio between Ga atoms and Ba atoms in the coating liquid (Ga:Ba) is 1:1.

Example 13

A magnesium 2-ethylhexanoate toluene solution (amount of Mg: 3 wt %) (2 mL), an yttrium 2-ethylhexanoate toluene solution (amount of Y: 8 wt %) (11 mL), and titanium n-butoxide (0.35 mL) were mixed. Then, toluene (15 mL) was added to the resultant mixture for dilution to obtain a coating liquid for forming a magnesium-titanium-yttrium oxide insulating film. A ratio among Mg atoms, Y atoms, and Ti atoms in the coating liquid (Mg:Y:Ti) is 2.5:10:1.

Example 14

Aluminium di(s-butoxide)acetoacetic ester chelate (amount of Al: 8.4 wt %) (0.94 mL), a magnesium 2-ethylhexanoate toluene solution (amount of Mg: 3 wt %) (5 mL), and an yttrium 2-ethylhexanoate toluene solution (amount of Y: 8 wt %) (11 mL) were mixed in toluene (20 mL) to obtain a coating liquid for forming a magnesium-aluminium-yttrium oxide insulating film. A ratio among Al atoms, Mg atoms, and Y atoms in the coating liquid (Al:Mg:Y) is 3:6.25:10.

Example 15

Barium neodecanoate (amount of Ba: 29 wt %) (0.48 g) was dissolved in toluene (10 mL). The resultant solution was mixed with a lanthanum 2-ethylhexanoate toluene solution (amount of La: 7 wt %) (4 mL) and a bis(2-ethylhexanoic acid) zirconium oxide mineral spirit solution (amount of Zr: 12 wt %) (0.76 mL) to obtain a coating liquid for forming a barium-zirconium-lanthanum oxide insulating film. A ratio among Ba atoms, La atoms, and Zr atoms in the coating liquid (Ba:La:Zr) is 1:2:1.

Example 16

Strontium neodecanoate (amount of Sr: 20 wt %) (0.43 g) was dissolved in toluene (10 mL). The resultant solution was mixed with a lanthanum 2-ethylhexate toluene solution (amount of La: 7 wt %) (4 mL) and a niobium(IV) 2-ethylhexanoate 2-ethylhexanoic acid solution (amount of Nb: 11 wt %) (0.83 mL) to obtain a coating liquid for forming a strontium-niobium-lanthanum oxide insulating film. A ratio among Sr atoms, La atoms, and Nb atoms in the coating liquid (Sr:La:Nb) is 1:2:1.

Example 17

A magnesium 2-ethylhexanoate toluene solution (amount of Mg: 3 wt %) (2 mL), a lanthanum 2-ethylhexate toluene solution (amount of La: 7 wt %) (20 mL), and tantalum ethoxide (purity: 99.98%) (1 mL) were mixed. To the resultant solution, toluene (25 mL) was added for dilution to obtain a coating liquid for forming a magnesium-tantalum-lanthanum oxide insulating film. A ratio among Mg atoms, La atoms, and Ta atoms in the coating liquid (Mg:La:Ta) is 2.5:10:4.

Example 18

In 1,2-ethanediol (15 mL), magnesium nitrate hexahydrate (0.77 g), lanthanum nitrate hexahydrate (4.3 g), and hafnium(IV) dichloride oxide octahydrate (0.82 g) were dissolved to obtain a coating liquid for forming a magnesium-hafnium-lanthanum oxide insulating film. A ratio among Mg atoms, La atoms, and Hf atoms in the coating liquid (Mg:La:Hf) is 3:10:2.

Example 19

In propylene glycol (10 mL), scandium nitrate pentahydrate (0.32 g) and strontium chloride hexahydrate (0.27 g) were dissolved to obtain a coating liquid for forming a scandium-strontium oxide insulating film. A ratio between Sc atoms and Sr atoms in the coating liquid (Sc:Sr) is 1:1.

Example 20

A lanthanum 2-ethylhexate toluene solution (amount of La: 7 wt %) (20 mL) and a calcium 2-ethylhexanoate mineral spirits solution (amount of Ca: 5 wt %) (0.8 mL) were mixed. To the resultant solution, toluene (12 mL) was added for dilution to obtain a coating liquid for forming a lanthanum-calcium oxide insluting film. A ratio between La atoms and Ca atoms in the coating liquid (La:Ca) is 10:1.
—Formation of Gate Insulating Layer—

The coating liquid was subjected to spin coating on the glass substrate on which the gate electrode was disposed, and was dried using an oven at 120° C. for 1 hour in the atmosphere. Then, the coating liquid was baked at 400° C. for 3 hours in an oxygen atmosphere to form a gate insulating layer. An average thickness of the gate insulating layer was 120 nm. The film was measured for dielectric constant in the same manner as in Example 1. The results are presented in Table 6. When X-ray diffraction was measured in the same manner as in Example 1, no peak was exhibited. Therefore, this insulating layer was found to be amorphous.
—Formation of Active Layer—

Indium nitrate (In(NO$_3$)$_3$·3EH$_2$O) (35.488 g) was weighed and was dissolved in ethylene glycol monomethyl ether (100 mL) to obtain liquid A.

Zinc nitrate (Zn(NO$_3$)$_2$·6H$_2$O) (29.749 g) was weighed and was dissolved in ethylene glycol monomethyl ether (100 mL) to obtain liquid B.

Molybdenum(VI) dioxide bis(acetylacetonato) (1.631 g) was weighed and was dissolved in ethylene glycol monomethyl ether (500 mL) to obtain liquid C.

The liquid A (99.8 mL), the liquid B (100 mL), the liquid C (20 mL), ethylene glycol monomethyl ether (180.2 mL), and 1,2-propane diol (400 mL) were mixed and stirred at room temperature to prepare a coating liquid for forming an oxide semiconductor film.

Next, the coating liquid for forming an oxide semiconductor film was coated by an inkjet method on a desired portion on the gate insulating layer, and was baked at 400° C. for 1 hour in the atmosphere, to form an active layer. A ratio among the elements (i.e., In atoms, Zn atoms, and Mo atoms) excluding oxygen in the obtained active layer is that In:Zn:Mo=99.8:100:0.2. In (positively trivalent) in In$_2$Zn$_2$O$_5$, which is a mother phase, undergoes substitutional doping with Mo (positively hexavalent) at a concentration of 0.2 at %, resulting in generation of carriers.

When the oxide semiconductor film was measured for carrier density by the Hall measurement in the same manner as in Example 1, the carrier density was $1.21 \times 10^{18}$/cm$^3$.

<Measurement of Transistor Characteristics>

The transistor characteristics were evaluated in the same manner as in Example 1. The calculated values of the field-effect mobility, the on/off ratio, and the subthreshold swing are presented in Table 6. In each of the Examples, the transfer characteristics did not exhibit hysteresis.

Each of the transistors in Examples 12 to 20 can achieve high mobility, high on/off ratio, and low subthreshold swing. Therefore, each transistor achieved sufficiently excellent properties in terms of practical applications.

wherein the gate insulating layer contains a paraelectric amorphous oxide containing a Group A element which is an alkaline earth metal and a Group B element which is at least one selected from the group consisting of Ga, Sc, Y, and lanthanoid, and wherein the active layer has a carrier density of $4.0 \times 10^{17}$/cm$^3$ or more.

<2> The field-effect transistor according to <1>,
wherein the gate insulating layer further contains a Group C element, which is at least one selected from the group consisting of Al, Ti, Zr, Hf, Nb, and Ta.

<3> The field-effect transistor according to <1> or <2>,
wherein the gate insulating layer has a dielectric constant of more than 7.0.

<4> The field-effect transistor according to any one of <1> to <3>,
wherein the active layer contains an n-type oxide semiconductor containing at least one selected from the group consisting of In, Zn, Sn, and Ti.

<5> The field-effect transistor according to <4>,
wherein the n-type oxide semiconductor undergoes substitutional doping with at least one dopant selected from the group consisting of a divalent cation, a trivalent cation, a tetravalent cation, a pentavalent cation, a hexavalent cation, a heptavalent cation, and an octavalent cation, and wherein a valence of the dopant is more than a valence of a metal ion constituting the n-type oxide semiconductor, provided that the dopant is excluded from the metal ion.

<6> The field-effect transistor according to any one of <1> to <5>,
wherein the active layer has a carrier density of $1.0 \times 10^{18}$/cm$^3$ or more.

<7> A display element including:
a light control element configured to control light output according to a driving signal; and
a driving circuit containing the field-effect transistor according to any one of <1> to <6> and configured to drive the light control element.

<8> An image display device configured to display an image corresponding to image data, the image display device including:

TABLE 6

| Nos. | Carrier density of semiconductor [/cm$^3$] | Dielectric constant of gate insulating layer | Mobility [cm$^2$/Vs] | On/off ratio | Subthreshold swing [V/decade] |
| --- | --- | --- | --- | --- | --- |
| Example 12 | 1.21E+18 | 10.6 | 9.86 | 5.44E+09 | 0.33 |
| Example 13 | 1.21E+18 | 9.3 | 10.25 | 4.98E+09 | 0.40 |
| Example 14 | 1.21E+18 | 8.6 | 6.92 | 2.40E+09 | 0.39 |
| Example 15 | 1.21E+18 | 13.5 | 14.54 | 8.26E+09 | 0.24 |
| Example 16 | 1.21E+18 | 12.1 | 13.42 | 8.60E+09 | 0.29 |
| Example 17 | 1.21E+18 | 12.6 | 15.60 | 9.10E+09 | 0.15 |
| Example 18 | 1.21E+18 | 11.2 | 9.76 | 3.87E+09 | 0.34 |
| Example 19 | 1.21E+18 | 7.5 | 8.86 | 4.63E+09 | 0.46 |
| Example 20 | 1.21E+18 | 10.4 | 10.01 | 7.60E+09 | 0.31 |

Aspects of the present disclosure are, for example, as follows.

<1> A field-effect transistor including:
a gate electrode, which is configured to apply gate voltage;
a source electrode and a drain electrode, which are configured to take electric current out;
an active layer, which is disposed to be adjacent to the source electrode and the drain electrode and is formed of an oxide semiconductor; and
a gate insulating layer, which is disposed between the gate electrode and the active layer, a plurality of display elements arranged in a form of matrix, each of the plurality of display elements being the display element according to <7>;

a plurality of wired lines configured to individually apply gate voltage and signal voltage to the field-effect transistors in the plurality of display elements; and a display control device configured to individually control the gate voltage and the signal voltage of the field-effect transistors via the plurality of wired lines correspondingly to the image data.

<9> A system including:
the image display device according to <8>; and
an image-data-generating device configured to generate image data based on image information to be displayed and to output the image data to the image display device.

What is claimed is:

1. A field-effect transistor comprising:
a gate electrode;
a source electrode;
a drain electrode;
an active layer; and
a gate insulating layer,
wherein the gate insulating layer contains a paraelectric amorphous oxide containing a Group A element which is an alkaline earth metal and a Group B element which is at least one selected from the group consisting of Ga, Sc, Y, and lanthanoid,
wherein the active layer has a carrier density of $4.0 \times 10^{17}/\text{cm}^3$ or more, and
wherein the gate insulating layer has a dielectric constant of more than 9.1.

2. The field-effect transistor according to claim 1, wherein the gate insulating layer has a dielectric constant of more than 10.4.

3. A field-effect transistor comprising:
a gate electrode;
a source electrode;
a drain electrode;
an active layer; and
a gate insulating layer,
wherein the gate insulating layer contains a paraelectric amorphous oxide containing a Group A element which is an alkaline earth metal and a Group B element which is at least one selected from the group consisting of Ga, Sc, Y, and lanthanoid,
wherein an atomic ratio between a total number (NA) of atoms of the Group A element and a total number (NB) of atoms of the Group B element, in the paraelectric amorphous oxide, satisfies the following:
NA≤NB, and
wherein the active layer has a carrier density of $4.0 \times 10^{17}/\text{cm}^3$ or more.

4. The field-effect transistor according to claim 3, wherein the atomic ratio between the total number (NA) of atoms of the Group A element and the total number (NB) of atoms of the Group B element, in the paraelectric amorphous oxide, satisfies the following:
NA:NB=3-50 at %:50-97 at % and
NA+NB=100 at %.

5. A display element comprising:
a light control element configured to control light output according to a driving signal; and
a driving circuit containing the field-effect transistor according to claim 3 and configured to drive the light control element.

6. An image display device configured to display an image corresponding to image data, the image display device comprising:
a plurality of display elements arranged in a form of matrix, each of the plurality of display elements being configured same as the display element according to claim 5;
a plurality of wired lines configured to individually apply gate voltage and signal voltage to the field-effect transistors in the plurality of display elements; and
a display control device configured to individually control the gate voltage and the signal voltage of the field-effect transistors via the plurality of wired lines correspondingly to the image data.

7. A system comprising:
the image display device according to claim 6; and
an image-data-generating device configured to generate image data based on image information to be displayed and to output the image data to the image display device.

8. A display element comprising:
a light control element configured to control light output according to a driving signal; and
a driving circuit containing the field-effect transistor according to claim 1 and configured to drive the light control element.

9. An image display device configured to display an image corresponding to image data, the image display device comprising:
a plurality of display elements arranged in a form of matrix, each of the plurality of display elements being configured same as the display element according to claim 8;
a plurality of wired lines configured to individually apply gate voltage and signal voltage to the field-effect transistors in the plurality of display elements; and
a display control device configured to individually control the gate voltage and the signal voltage of the field-effect transistors via the plurality of wired lines correspondingly to the image data.

10. A system comprising:
the image display device according to claim 9; and
an image-data-generating device configured to generate image data based on image information to be displayed and to output the image data to the image display device.

11. A field-effect transistor comprising:
a gate electrode;
a source electrode;
a drain electrode;
an oxide semiconductor layer having a carrier density of $4.0 \times 10^{17}/\text{cm}^3$ or more; and
a gate insulating layer,
wherein the gate insulating layer contains an oxide containing a Group A element which is an alkaline earth metal and a Group B element which is at least one selected from the group consisting of Ga, Sc, Y, and lanthanoid, and
wherein an atomic ratio between a total number (NA) of atoms of the Group A element and a total number (NB) of atoms of the Group B element, in the oxide, satisfies the following:
NA≤NB.

12. The field-effect transistor according to claim 11, wherein the atomic ratio between the total number (NA) of atoms of the Group A element and the total number (NB) of atoms of the Group B element, in the oxide, satisfies the following:
NA:NB=3-50 at %:50-97 at %; and
NA+NB=100 at %.

13. A display element comprising:
a light control element configured to control light output according to a driving signal; and
a driving circuit containing the field-effect transistor according to claim 11 and configured to drive the light control element.

14. An image display device configured to display an image corresponding to image data, the image display device comprising:
- a plurality of display elements arranged in a form of matrix, each of the plurality of display elements being configured same as the display element according to claim 13;
- a plurality of wired lines configured to individually apply gate voltage and signal voltage to the field-effect transistors in the plurality of display elements; and
- a display control device configured to individually control the gate voltage and the signal voltage of the field-effect transistors via the plurality of wired lines correspondingly to the image data.

15. A system comprising:

the image display device according to claim 14; and an image-data-generating device configured to generate image data based on image information to be displayed and to output the image data to the image display device.

* * * * *